US005771178A

United States Patent [19]

Stemporzewski, Jr. et al.

[11] Patent Number: 5,771,178

[45] Date of Patent: Jun. 23, 1998

[54] FAIL-SAFE FLUID TRANSFER CONTROLLER

[75] Inventors: Francis V. Stemporzewski, Jr., Salem, N.H.; Arthur W. Shea, W. Somerville; Gary R. Cadman, Norwell, both of Mass.; Richard O. Beaulieu, Danville, N.H.; Stephen F. Tougas, Framingham, Mass.

[73] Assignee: Scully Signal Company, Wilmington, Mass.

[21] Appl. No.: 489,220

[22] Filed: Jun. 12, 1995

[51] Int. Cl.[6] .............................. G06F 11/16; B67D 5/32; H03K 19/14; H04B 10/00

[52] U.S. Cl. .......................... 364/510; 364/509; 364/550; 364/228.3; 364/229; 364/230; 137/487.5; 137/392; 137/391; 137/395; 73/290 R; 73/302; 73/316; 361/215; 361/217; 361/170; 361/178; 340/612; 340/618; 340/603; 340/649; 340/825.34; 340/825.54

[58] Field of Search .................................... 364/510, 184, 364/221, 221.7–221.9, 228, 228.3, 229–230, 230.4, 942.3, 943.9, 509, 550, 551.01; 137/386, 390–392, 395, 267, 456, 487.5, 637.05; 73/290 R, 302, 316, 863.86; 361/160, 170, 178, 191, 212, 215, 216, 217; 340/612, 618, 649, 603, 500, 825.34, 825.37, 825.72, 825.54

[56] References Cited

U.S. PATENT DOCUMENTS

| | | | |
|---|---|---|---|
| 4,162,521 | 7/1979 | Snyder | 362/113 |
| 4,313,228 | 1/1982 | Berstein | 359/144 |
| 4,354,571 | 10/1982 | Lakin et al. | 180/271 |
| 4,638,412 | 1/1987 | Weigert | 362/156 |
| 4,874,015 | 10/1989 | Schirmacher | 137/637.05 |
| 4,901,195 | 2/1990 | Stemporzewski, Jr. | 361/217 |
| 5,204,819 | 4/1993 | Ryan | 364/464.23 |
| 5,324,996 | 6/1994 | Mote, Jr. | 326/21 |
| 5,349,994 | 9/1994 | Koeninger | 141/94 |
| 5,412,616 | 5/1995 | Gonzalez | 367/13 |
| 5,422,628 | 6/1995 | Rodgers | 340/573 |
| 5,438,323 | 8/1995 | Shea | 340/620 |
| 5,507,326 | 4/1996 | Cadman et al. | 141/198 |
| 5,534,856 | 7/1996 | Cadman | 340/825.34 |

FOREIGN PATENT DOCUMENTS

| | | |
|---|---|---|
| 4322230 | 1/1995 | Germany . |
| 4431378 | 9/1995 | Germany . |

OTHER PUBLICATIONS

"System for the unmistakable temporary connection of tank compartments of a tanker truck with a stationary receiving tank", Arndt et al, PTO 97–2008 (DE 4431378 C1, Sep 14 1995), Mar. 1997.

"System for the unconfusible association of a safety system with a tank caompartment of a tank car", Herrmann Popken, PTO 97–2063 (DE 4322230 C1, 19 Jan. 1995), Mar. 1997.

*Primary Examiner*—James P. Trammell
*Assistant Examiner*—Tuan Q. Dam
*Attorney, Agent, or Firm*—Kudirka & Jobse, LLP

[57] ABSTRACT

A fail-safe fluid transfer control apparatus has full redundancy in the response to various inputs such as overfill probe signals, ground detection signals, and the like. Independent microprocessor controllers independently evaluate the inputs and each output control signals to close a respective relay when the inputs indicate that fluid transfer may commence. The relays are arranged in series such that both must be closed for a fluid transfer to commence. The control signals from each controller include a static signal and an alternating signal, both of which must be properly output to close its respective relay. Each controller monitors the state of each relay, and discontinues its control signals if either relay appears to be malfunctioning. Each controller runs an different, independently written firmware program to process the detected inputs to prevent a common firmware error. An optical bypass key replaces conventional mechanical keys and transmits an optically encoded signal to the controller for establishing a bypass condition. A preheating circuit is also provided for providing a dynamic voltage supply to standard thermistor probes which may be encountered.

42 Claims, 25 Drawing Sheets

FAIL-SAFE FLUID TRANSFER CONTROLLER

BACKGROUND OF THE INVENTION

1. Field of the Invention

This invention is in the field of fluid transfer control and, particularly, in the area of providing safety during the transfer of flammable fluids, such as petroleum products.

2. Description of the Related Art

Controlling the safe and proper transfer of flammable fluids when loading transportation vehicles such as tanker trucks has long been a concern in the petroleum industry. In recent years, safety devices have been implemented on tanker trucks which prevent fluid transfer from a loading terminal to the truck if certain unsafe conditions surrounding the transfer exist. These devices use detection equipment to determine if all of the safety precautions have been taken, and inhibit fluid flow if they have not. The inhibiting of fluid flow is controlled electrically, by closing a valve in a fluid transfer conduit, or by disabling a pump which is responsible for transferring the fluid to the tanker.

FIG. 1 is a block diagram of a prior art system having control circuitry 10 which controls either the valve or pumping mechanism (or both) based on a number of different inputs. This figure demonstrates some of the input sources which are known in the art for controlling fluid transfer. Prior art systems may have some or all of the inputs shown in FIG. 1. If all of the necessary input signals are not in the proper state, the transfer of fluid is inhibited. In this manner, hazardous filling conditions are avoided.

Many fluid flow control systems use a real-time clock 12 such as that shown in FIG. 1. The clock input is used in conjunction with a memory unit of the control circuitry 10 to store time stamps indicative of when certain noteworthy events occur. That is, each time the system is operated to allow the transfer of fluid to or from a compartment of the tanker, the nature of the event is recorded in some encoded manner, along with the time as indicated by the input signal from clock 12. Thus, if any efforts are made to defeat the pump/valve control circuitry 10 (i.e. and transfer fluid under unsafe conditions) a record of the event is created. This acts as a deterrent to those who might try to engage in such a defeat of the system.

A "deadman" switch 14 has also been used which requires that an operator controlling the fluid transfer manually hold a switch mounted at the loading terminal closed during the entire loading or unloading process. This ensures that the operator is always present while the fluid transfer is taking place, so that an appropriate action may be taken if any problem occurs. The deadman switch 14 specifically addresses the problem of operators walking away from the equipment while a fluid transfer is underway.

ID sensor circuit 16 is typical of a truck identification system for which a memory unit is located on the truck in which is stored a unique identification (ID) number. When the truck is at the loading terminal, a signal line between the truck and the terminal is connected to allow the ID circuit 16 to access the memory unit on the truck to read the ID number. The truck ID number is then compared to a list of valid truck ID numbers, and the fluid transfer is inhibited if the truck's ID number does not match a number on the list. A system of this type is described in U.S. patent application Ser. No. 08/154,346, (now U.S. Pat. No. 5,534,856)which is assigned to the assignee of the present invention, and which is incorporated herein by reference.

The other input device shown in FIG. 1 is ground sensor circuit 18. One common safety concern during transfer of a flammable fluid is that of static electric discharges in the vicinity of the flammable fluid. A sufficient difference in the electrical potential of the tanker truck and a terminal from which it is loaded can result in an electrical arc which might ignite the nearby vapors of the fluid being transferred. For this reason, a commonly-accepted safety precaution is the establishment of a common electrical ground between the truck and the loading terminal. To ensure that such a common ground is established, non-defeatible ground sensor circuit 18 is used to verify the common ground, and inhibits fluid flow if the ground is not in place. An example of such a circuit may be found in U.S. Pat. No. 4,901,195, which is assigned to the assignee of the present invention, and which is incorporated herein by reference.

Another type of input is the overfill sensor circuit 13, of which a number of different types exist in the prior art. In general, the overfill sensor circuit consists of probes which detect when the fluid level in any of the compartments of a tanker truck exceeds a predetermined level. The control circuitry 10 responds to the indication of an overfill condition by discontinuing fluid flow to the truck.

While the various types of control inputs help ensure the safety of a fluid transfer operation, their effectiveness depends on the proper functioning of the control circuitry 10. Most such circuits tend to have switches which enable the pump or valve in question, but which are normally open when the system is off or when inputs to the control circuitry indicate that the fluid transfer should be disabled. However, if the control circuitry itself should malfunction in a manner which inhibits the ability to disable the fluid flow, an unsafe fluid transfer situation can result.

SUMMARY OF THE INVENTION

The present invention provides a fail-safe fluid transfer control circuit which includes a plurality of switches in series, each of which must be closed to provide power to a pump or valve that enables fluid transfer. A plurality of independent controllers are provided which, in the preferred embodiment, are microprocessors, and each of which monitors the switched state (i.e. open or closed) of each of the switches. Each of the controllers also responds to a number of the same inputs with regard to enabling or disabling fluid flow. If one of the controllers senses that one of the other switches is in a closed state when the input conditions warrant it being in an open state, that controller opens the switch it controls, and does not close it until the problem corrects itself or until the problem is corrected by a service person. Thus, the two controllers provide mutual monitoring of each other and of themselves.

The use of two parallel controllers, identified in the preferred embodiment as the "main microprocessor" and the "backup microprocessor" provide a particularly fail-safe system in that much of the control of the fluid transfer is redundant. The controllers each receive inputs from an overfill sensor circuit and a ground sensor circuit, and each responds independently to the same inputs to either inhibit fluid flow or indicate that fluid flow is permissible. In the preferred embodiment, the switches controlled by the microprocessors are normally-open relays which are arranged in series and which, therefore, must both be closed if fluid flow is to be enabled.

The closure of each of the relays is controlled by switching a current flow through a respective relay coil. Each coil is preferably arranged in series with two transistor switches, both of which must be closed to energize the relay. Each series pair of transistors is controlled by one of the microprocessors with two different output signals. A first transistor of a pair receives a DC signal directly from its controlling microprocessor which switches the transistor "on". The other transistor of the pair (which also must be on to energize the relay) is controlled by the output of a charge pump, which outputs a DC control signal to the transistor when it receives an alternating signal from the microprocessor controlling that relay. The requirement that a microprocessor outputs both a static and an oscillating voltage signal before its relay will close prevents a "latch-up" condition (in which the microprocessor might accidentally output a static DC signal) from causing closure of the controlled relay.

In addition to the hardware redundancy of the rack controller, a firmware redundancy is also provided. Each microprocessor of the system is controlled by distinctly different firmware, written independently of the firmware for the other microprocessor. This ensures that no single-point software failure (i.e. a single software "bug") will cause both microprocessors to fail at the same time. In particular, the firmware for one of the microprocessors consists of a single program flow, with multiple, branch instructions to direct the control to the appropriate program portions. The firmware for the other microprocessor, however, has an interrupt driven probe sampling routine, and makes use of, a plurality of finite state machines which track various condition variables of interest.

The two microprocessors also use two different methods of detecting signals generated by the overfill probes. The backup microprocessor uses a conventional, hardware-based comparator circuit detection method for most of its signal detection except for 5-wire series probes. However, the main microprocessor receives the probe signals directly, converting them to periodic digital samples every two milliseconds with analog-to-digital (A/D) converters. The A/D converters convert the instantaneous voltage value of the probe values to either a logical "one" or a logical "zero", depending on the value of the signal relative to one of two threshold levels maintained by each of the A/D converters. The probe samples thus appear as multiple bit streams of high and low logic levels, each bit stream corresponding to one probe channel. The bit streams are assembled into an array, and analyzed by the microprocessor, which then determines whether the rate at which the logic levels of each probe change (being indicative of probe oscillation frequency) are within the appropriate range.

In addition to signals from the overfill sensor circuit and the ground sensor circuit, which are detected by both microprocessors, the main microprocessor also detects other signals from a vapor flow sensor circuit, and an ID sensor circuit. Since these input signals are not critical to preventing a hazardous filling situation as are conditions such as an overfill of one of the compartments or a lack of a common ground between the truck and the loading terminal they are not detected by the backup microprocessor. The main microprocessor also provides outputs to a display panel, which indicates various system conditions to a user of the rack controller. Both microprocessors are able to receive an input from a clock circuit, and both are connected to a serial communication port, which allows communications between a host computer and several rack controllers. In addition, programming jumpers are provided by which inputs to the main and backup microprocessors may be altered, thus allowing them to be customized to a particular application. Such programming jumpers are known in the art.

In the preferred embodiment, a bypass control is provided by which a terminal manager may override certain preventative conditions of the rack controller. While prior art controllers have used a mechanical lock cylinder and key, the present invention provides an optical bypass key which transmits an optically encoded code number to the rack controller. A bypass condition is established when the main and bypass microprocessors verify that the code number is correct and on a stored list of authorized code numbers maintained by the main microprocessor. Using the optical bypass key of the present invention, the accessibility of the bypass circuit to a driver is decreased, thus reducing the likelihood of tampering. Furthermore, the encoded signal is only allowed to initiate a bypass when conditions exist that are actually preventing a fluid transfer (e.g. an incorrect ID number for ID circuit 16). A bypass condition can not be created if there is no need for one.

Another feature of the present invention relates to one of the overfill probe types which may be encountered. Standard style thermistor-type probes take a considerable amount of time to warm up before reaching their operating temperature. The speed at which the warm-up occurs is non-linearly proportional to the supply voltage which feeds the thermistor probe. This voltage supply is preferably ten volts while the thermistor temperature is in the operating range. However, the present invention provides a twenty-volt "jump-start" supply which powers the thermistor during the warm-up period. This results in a faster warm-up of the thermistor. Once the operating temperature is reached, the twenty-volt "jump-start" supply is replaced by the ten-volt supply.

DETAILED DESCRIPTION OF THE PREFERRED EMBODIMENT

Figure 2:
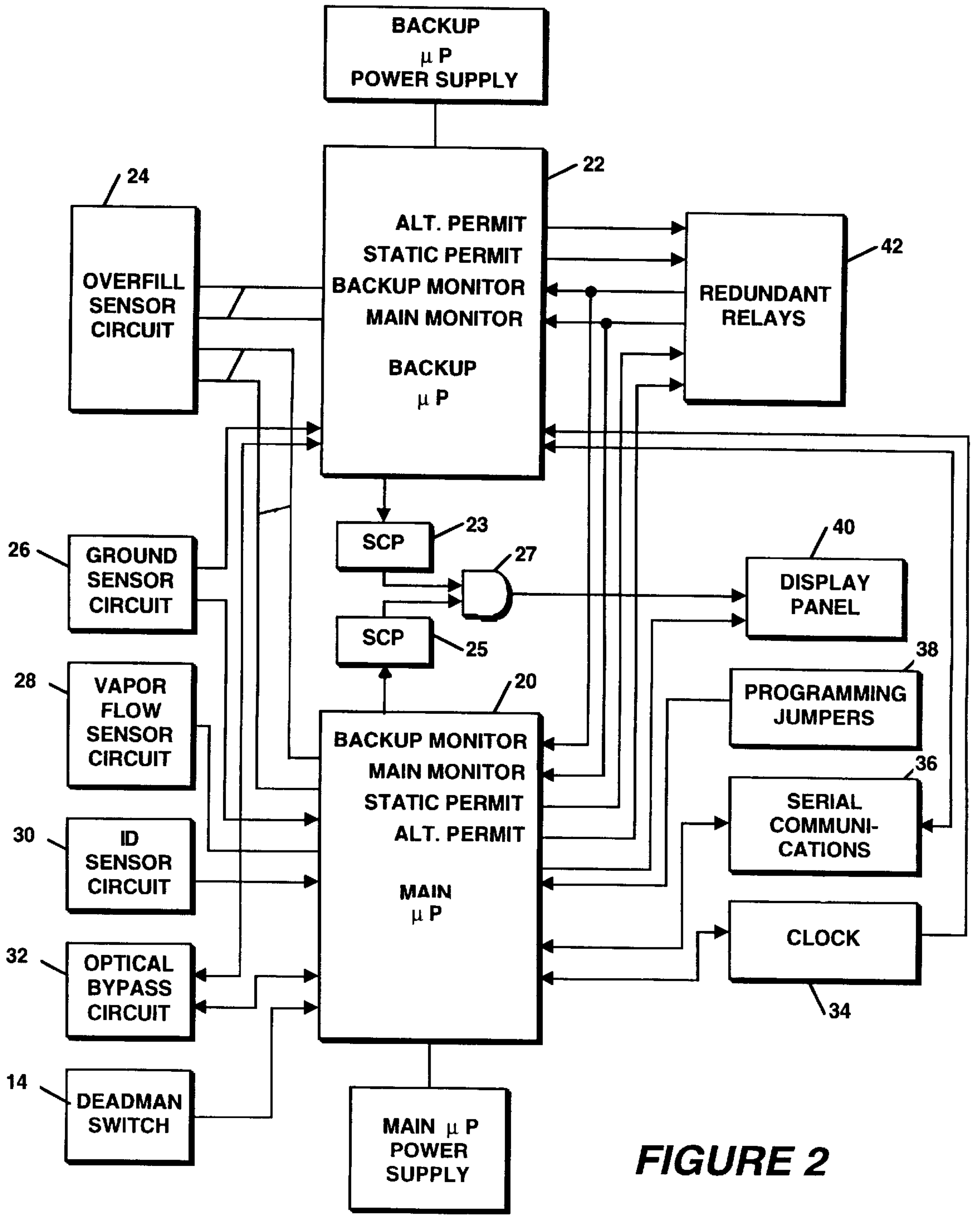
FIG. 2 is a block diagram of a fluid transfer controller according to the present invention.

Shown in the block diagram of FIG. 2 is the control circuitry for a fluid transfer system which, in the preferred embodiment, is located on the rack of a loading terminal, such as is used for the loading of a petroleum tanker truck. The control circuitry includes a main microprocessor ($\mu$P) 20 and a backup microprocessor ($\mu$P) 22. When the truck is at a loading terminal to receive a transfer of fluid from the terminal to a compartment of the truck, an electrical connection is provided between the truck and the terminal which allows signals to be transferred between the truck and the main $\mu$P 20 and backup $\mu$P 22. The microprocessors 20, 22 function in parallel to control the transfer of fluid to the truck by outputting "permit" signals which enable a fluid transfer apparatus (typically a valve or a pump at the loading terminal) only when all the inputs to the microprocessors 20, 22 are in the correct state.

The main $\mu$P 20 receives a number of inputs from various sensor circuitry including: overfill sensor circuit 24; ground sensor circuit 26; vapor flow sensor circuit 28; ID sensor circuit 30; and optical bypass circuit 32. Each of these sensor circuits provides a separate input (or inputs) to the main $\mu$P 20. The main $\mu$P 20 accesses these inputs as part of an internal firmware program which determines whether to allow the flow of fluid into of the truck (i.e. whether to output a "permit" signal to the fluid transfer apparatus). The purpose of each of the input circuits 24–32 is discussed below.

The overfill sensor circuit 24 is a circuit which supports fluid level sensors (i.e. probes) in the different compartments of the tanker truck. Different varieties of overfill sensor circuits have been used in the past. In short, the overfill protection circuit, in conjunction with the probes, provides an output for each of the compartments that indicates whether the fluid level in that compartment has exceeded a predetermined level. To prevent the compartments from being overfilled, the main $\mu$P 20 switches off the fluid flow at the loading rack when the output signal from a compartment indicates that its fluid level has exceeded the predetermined level. As discussed below, the signal may be somewhat different depending on the type of probes used in the truck. The present invention accommodates each probe type.

The ground sensor circuit 26 provides an output signal which indicates whether a common ground has been established between the tanker truck and the terminal from which the truck is being loaded. This signal is received by both the main microprocessor and the backup microprocessor. These types of ground sensor circuits have also been used in the past. To prevent a large voltage differential from building up between the truck and the terminal (which could result in an electrical arc with the capacity to ignite the fumes of a flammable fluid product), the main $\mu$P 20 and backup $\mu$P use the output signal of the ground sensor circuit 26 to inhibit fluid flow when the output signal indicates that no common ground has been established between the truck and the terminal.

Vapor flow sensor circuit 28 is another type of input source which is known in the art of fluid transfer systems. During loading of a truck compartment, a vapor recovery hose is used to recover the fluid vapor which is displaced from the compartments of the tanker truck as fluid is loaded into it. In order to prevent loading of the truck when the vapor recovery hose is not properly connected, a flow sensor in the vapor recovery piping at the loading rack is used which provides an input, via sensor circuit 28, to main $\mu$P 20 indicative of when vapor is flowing through the hose. Subject to an initial wait period after fluid transfer begins (to allow for the lag time between fluid flow into a compartment and subsequent vapor flow out of the compartment), the absence of a signal from the flow sensor 28 (which signal indicates that vapor is flowing through the vapor recovery hose) results in the main $\mu$P halting the fluid transfer by discontinuing the output of the "permit" signal.

ID sensor circuit 30 is yet another known type of input device, and receives identification information stored in a ID module on the truck. The ID module, typically an electronic memory unit, contains information which uniquely identifies the truck. Upon the detection of this information, the main $\mu$P 20 accesses a stored list of trucks and/or truck owners which indicates, amongst other things, whether the truck is authorized for loading. If the information from the ID module does not correspond to an authorized vehicle on the list, the main $\mu$P 20 prevents the loading of the truck by not outputting the "permit" signal.

Deadman switch 14 is identical to those used in the past, and is described in the "Background" section of the application.

Optical bypass circuit 32 is an input which allows a terminal manager to bypass the preventative mechanisms of the microprocessors 20, 22. In certain situations, it may be desirable to manually disable the automatic protections provided by the fluid flow control system. For example, although a particular vehicle may not be on the authorization list accessed by the main $\mu$P 20, a terminal manager may determine that the vehicle is, in fact, authorized to receive fluid product. In such a case a particular coded input to the microprocessors 20, 22 via the optical bypass circuit 32 can be used to enable the fluid transfer despite the failure of the ID information to match an authorized item on the list. Similarly, situations may arise in which it is desirable to allow the transfer of fluid product despite the fact that the inputs from the overfill sensor circuit 24, the ground sensor circuit 26 or vapor flow sensor circuit 28 do not indicate a proper loading condition.

Bypass systems in the past have typically involved a key which turns an electrical switch to override certain preventative systems that a terminal might have. While such devices were able to accomplish the desired bypassing task, they suffered from at least two problems avoided by the optical bypass system of the present invention. Firstly, the prior art systems encouraged frustrated drivers to attempt to engage the bypass mechanism themselves by tampering with the physical key cylinder. Secondly, the electrical switch provided an unrestricted means of bypassing a perceived problem which might not have actually existed, thus compromising the overall safety aspects of the system. The optical system of the present invention, described in more detail hereinafter in conjunction with FIGS. 14–14B, uses an encoded optical signal which passes through a flat translucent panel on the control circuitry housing. The translucent panel does not itself appear defeatible, and is therefore not as likely to be tampered with by a driver. The detection of a proper code causes a bypass condition to be initiated for a truck which is connected to the controller, and the bypass condition is terminated when the truck is disconnected. Since the main microprocessor must recognize the optical code as being on an authorized list, any attempts at defeating the security are not likely to succeed.

Also shown in FIG. 2 as having an input to main μP 20 and backup μP 22 is a real-time clock 34, which is preferably internal to a housing containing the microprocessors 20, 22. In the preferred embodiment, the clock is of a type commercially available from the Dallas Corporation. The accuracy of the clock is within one minute per month, and it is used for chronologically labeling events recorded by the main μP 20 and backup μP 22.

A serial communications port 36 allows the main μP 20 and backup μP 22 to communicate with other existing or future loading terminal control mechanisms. The preferred embodiment uses an RS-485 type port. The serial port allows the control unit to be interconnected with other controllers on the same or other loading racks of the loading terminal, or with the control systems of future loading control mechanisms which could control fluid flow based on serial communications regarding the "permissive" condition of the unit. Also, the backup μP 22 monitors communications by the main μP 20 about the probe status and will not let the main μP report a "dry" permissive status unless the backup μP agrees, providing fail-safe probe status condition communications.

Programming jumpers 38 allow the customization of the main μP 20 to the particular loading rack with which it is associated. For example, if multiple fluid control systems were interconnected, as mentioned above, the programming jumpers of each could be used to provide each with a unique identifying address. The jumpers can also be used to set the particular communications protocol parameters for communication conducted through the serial communications port 36. In general, the use of programming jumpers to customize the operation of fluid control systems is known in the art, and the use of such jumpers in the present invention is consistent with such use.

Display panel 40 receives outputs from the main μP 20 and backup μP 22 to provide visual indicators to those engaged in loading a truck. In the preferred embodiment, the panel 40 consists of a plurality of light emitting diodes (LEDs) which indicate various conditions of the fluid transfer control system. LEDs are used for indicating the status of each of the compartments for which a sensor input is provided via overfill sensor circuit 24. These status indicators allow the diagnosis of any conditions which may be causing the microprocessors 20, 22 to inhibit fluid flow.

For each compartment, a red LED is illuminated to indicate that its associated compartment has an overfill condition, or that it has a faulty probe. Two green LEDs are used to indicate, respectively, the output and receipt of 5-wire optical pulses by the main μP for 5-wire optical type overfill sensors. A red LED is used to indicate that no ground between the truck and the loading terminal is detected by the ground sensor circuit 26. Another red LED is used to indicate that proper vapor flow is not detected by vapor flow sensor circuit 28. A yellow LED is used to indicate that the serial communications port 36 is active.

In addition to the above LEDs, a bank of twenty-six red and twenty-six green LEDs are used to indicate the enable/disable status of the outputs controlling the pumping equipment. A constant illumination of the red LED bank indicates that one of the sensor circuit inputs is disabling fluid flow. A flashing of the red LED bank indicates that the overfill sensor has been bypassed by an input from the bypass circuit 32. A constant illumination of the green LED bank indicates that all of the inputs from the sensor circuits 24, 26, 28, 30 are in a state to permit fluid transfer. A flashing of the green LED bank indicates that either the ground sensor circuit 26, the vapor flow sensor circuit 28 or the ID sensor circuit 30 has been bypassed by an input from bypass circuit 32, or bypassed by a communications command received by the main μP 20 and the backup μP 22 via serial communications port 36.

Also included in the preferred embodiment is a red service LED on display panel 40 which indicates when a malfunction has occurred with the rack controller. The otherwise flashing LED is held off by the output of AND gate 27 (FIG. 2). The AND gate 27 is fed by the output of two "service" charge pumps 23, 25 (labeled "SCP" in FIG. 2), which are of known design. When the microprocessors 20, 22 are functioning properly, they each output an alternating signal to their respective charge pumps 23, 25, which keeps the output of the charge pumps at a predetermined positive voltage. This high voltage inhibits the illumination of the LED in a known way. However, if one of the microprocessors fails or "latches up", the alternating output is either zero, or a DC voltage. Either of these input signals causes the charge pump it feeds to output a low voltage (preferably zero volts). This causes the normally high output voltage of the AND gate 27 to switch to a low voltage which, in turn, results in the LED being illuminated.

Another condition under which the service LED will flash is the existence of a short circuit between probe channels which may be detected when no truck is connected to the controller. The test is periodically conducted by the firmware of the main μP 20 when the absence of a truck is detected. The test involves the sequential application of an excitation voltage to each of the probe channels while simultaneously monitoring the other channels. If a sufficiently high voltage is detected on any of the other channels, a flag is set in the main μP 20 firmware which prevents the output of a permit signal and causes the service LED to flash.

In the present invention, microprocessors 20, 22 control the pumping mechanism at the loading terminal by providing signals to redundant relays 42. To accomplish the fail-safe control of the system, the microprocessors 20, 22 work in parallel, each providing permit signals to a different one of two relay control circuits. In addition, each microprocessor 20,22 detects the status (i.e. open or closed) of each of the relays, and the status of the other μPs "alternating permit" signal (described below). The arrangement of microprocessors 20, 22 and relays 42 is shown in more detail in FIG. 3.

Figure 3:
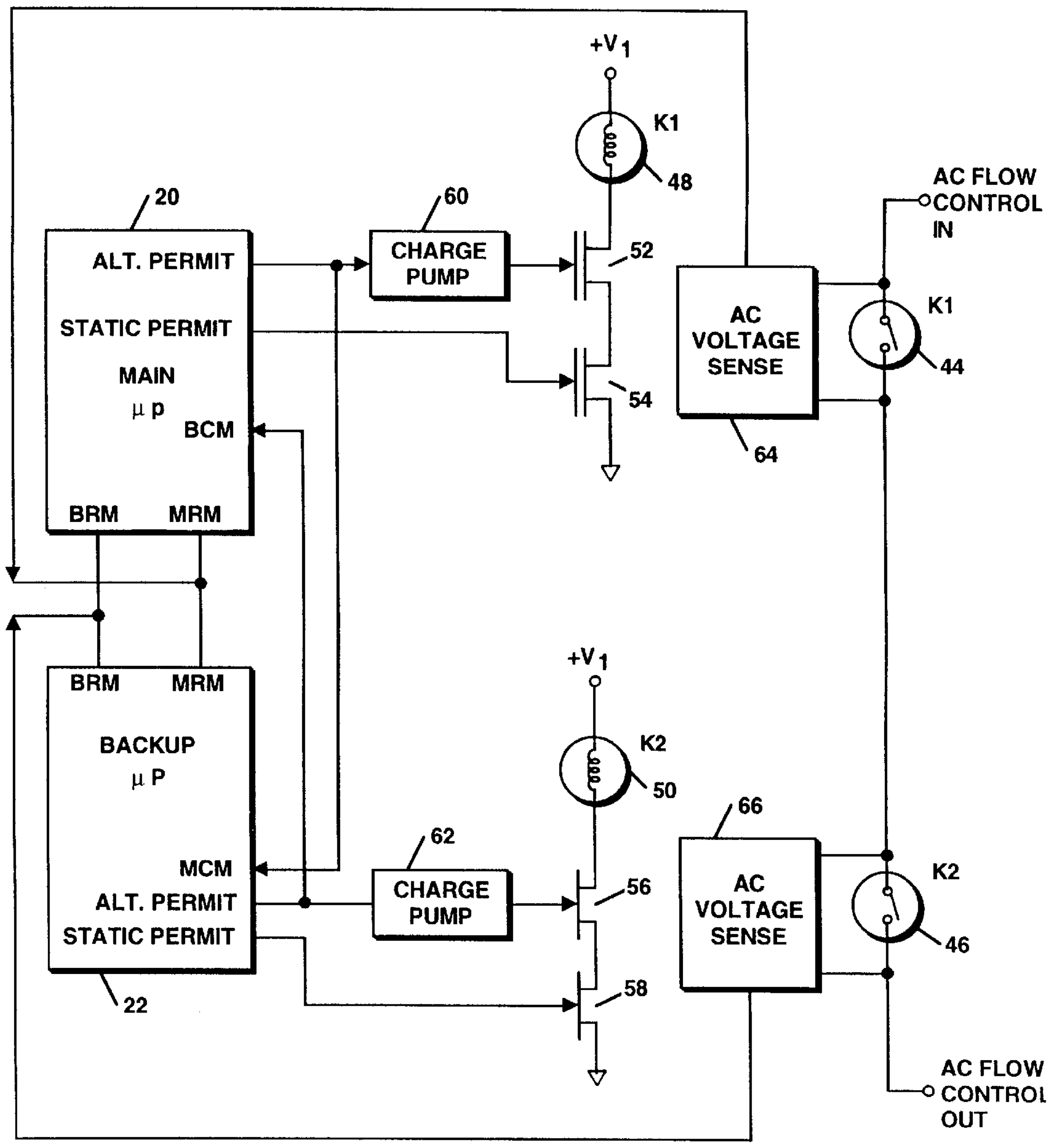
FIG. 3 is a schematic illustration of the redundant control of relays used with a fluid transfer controller according to the present invention.

The enabling of the pumping equipment at the loading terminal requires a closed circuit path through two individual relay contacts K1 and K2, which are arranged in series. As shown in FIG. 3, the "AC flow control input" and "AC flow control output" are two terminals between which is the series arrangement of the respective switch portions 44 and 46 of relays K1 and K2. If the fluid pump receives the AC flow control signal at the output port, the pump is enabled. If either of the two relay switches 44, 46 is open, the AC signal is inhibited, and the fluid pump is disabled. The switches 44, 46 are normally open, and are closed only by the energizing of their respective relay coils 48, 50. Each of relay coils 48, 50 is in a series configuration with two transistors, which in the preferred embodiment, are field-effect transistors (FETs). FETs 52 and 54 are in series with relay coil 48, while FETs 56 and 58 are in series with relay coil 50.

A DC voltage ($V_1$) across the series arrangement of each coil 48, 50 and its associated FETs provides the source for a sufficient energizing current. The flow of the energizing current is controlled by voltages on the gate terminals of each of the FETs. When the gate voltages of a series pair of FETs (e.g. FETs 52, 54) allow sufficient source-to-drain current flow through those FETs, current also flows through the associated coil (e.g. coil 48). This energizes the coil and closes the switch portion of the relay (e.g. switch 44). However, if the gate voltage of either of the series FET pair does not enable a sufficient source-to-drain current flow through that FET, the energizing of the associated coil (and corresponding closing of the switch it controls) is prevented. As such, the AC flow control signal can be inhibited by controlling any of the four signals on the gate terminals of FETs 52, 54, 56, 58.

Each microprocessor 20, 22 controls one series FET pair, main $\mu$P 20 controlling FETs 52, 54 and backup $\mu$P 22 controlling FETs 56, 58. Both microprocessors control their respective FETs using two output signals: "static permit" and "alternating permit." The following description of the generation of these two signals will make reference to the main $\mu$P 20 and FETs 52, 54. However, it will be understood that, in this capacity, both microprocessors function in the same manner, and that the description is equally applicable to backup $\mu$P 22.

When the fluid control system is connected to a truck to be loaded, and all of the inputs to the main $\mu$P 20 indicate that fluid flow should be permitted (or that these preventative inputs are bypassed using bypass circuit 32) the main $\mu$P generates its "permit" output in the form of the two aforementioned signals "static permit" and "alternating permit." The "static permit" signal is a DC signal which is directly coupled from the main $\mu$P 20 to the gate terminal of FET 54 (thus enabling source-to-drain current flow through FET 54). The "alternating permit" signal is a signal which alternates between logic states (i.e. between zero volts and a positive voltage) and which is coupled to charge pump 60.

The changing of the voltage level of the "alternating permit" signal is part of a firmware program which is run by the main $\mu$P 20. The charge pump 60 is of known design, and outputs a DC voltage when the "alternating permit" signal is changing voltage levels at the rate dictated by the main $\mu$P program (which, in the preferred embodiment is a minimum of three Hertz). However, if the "alternating permit" signal is not changing voltage levels appropriately (e.g. is zero volts or a constant DC voltage), the charge pump output is insufficient to provide a source-to-drain current through FET 52 high enough to energize relay coil 48 (and is preferably zero volts). Thus, if the main $\mu$P 20 "locks-up" (i.e. ceases to process its firmware program), the output of a DC signal on the "alternating permit" output line is not sufficient to enable fluid flow from the loading terminal to the truck. Charge pump 62 is of the same design as charge pump 60, and the "static permit" signal and "alternating permit" signal of backup $\mu$P 22 control FETs 56 and 58 in the same manner as the main $\mu$P outputs control FETs 52, 54.

In addition to providing parallel control of relays K1 and K2, the microprocessors 20, 22 each monitor the status of both relay switches 44, 46 and the "alternating permit" signal of the opposite microprocessor. As shown in FIG. 3, AC voltage sensing circuits 64, 66 are provided to monitor the signals across relay switches 44, 46, respectively, and the "alternating permit" signals are monitored at the inputs to the charge pumps 60, 62, respectively. When switch 44 is open, the AC voltage developed across the switch 44 is detected by AC sensing circuit 64 whereas, when switch 44 is closed, no detectable voltage difference exists across the switch 44. Similarly, when switch 46 is open, a detectable voltage is developed across the switch 46 and, when the switch 46 is closed, no voltage exists.

To allow each of the microprocessors to determine the state of both relays, each of the AC sensing circuits 64, 66 provides an output signal to both microprocessors. Each of these signals is in a different state depending on whether the AC sensing circuit which generates it detects a voltage across its associated relay switch. Thus, the two monitored signals indicate the state (i.e. open or closed) of the two relays. The signal generated by AC sensing circuit 64 (which monitors the switch controlled by main $\mu$P 20) is labeled "main relay monitor," (abbreviated "MRM" in FIG. 3) while the signal generated by AC sensing circuit 66 (which monitors the switch controlled by the backup $\mu$P 22) is labeled "backup relay monitor" (abbreviated BRM in FIG. 3). The "alternating permit" signal generated by the main $\mu$P is monitored by the backup $\mu$P as signal input "main charge monitor" (abbreviated MCM in FIG. 3), while the "alternating permit" signal generated by the backup $\mu$P is monitored by the main $\mu$P as "backup charge monitor" (abbreviated BCM in FIG. 3).

The "main relay monitor" and "backup relay monitor" signals, and the "main charge monitor" and "backup charge monitor" signals provide an additional level of safety in the fluid transfer operation. During normal operation (with no bypass having been initiated), the main $\mu$P 20 and the backup $\mu$P 22 should generate the same "permit" outputs in response to the any combination of inputs from the overfill sensor circuit 24 and the ground sensor circuit 26. Thus, both of the relay switches 44 and 46 should be open, and neither of the "alternating permit signals" should be present, when the inputs from the overfill sensor circuit 24 or the ground sensor circuit 26 indicate that fluid flow should be disabled. As part of the firmware programs of both microprocessors 20, 22, if either of the switches 44, 46 is closed in this situation, or either of the charge pumps 60, 62 is being driven, it indicates a failure of either that relay, the relay's circuitry or the microprocessor which controls that relay. For this reason, either microprocessor which detects this failure state enters a "lockout" state in which it disables the operation of its relay, thus inhibiting fluid flow. This condition is maintained until the condition corrects itself, or until a qualified service person investigates the failure and makes any necessary repairs.

Because the backup $\mu$P 22 does not receive inputs from the vapor flow sensor circuit 30 or the ID sensor circuit 30, a situation may exist in which the main $\mu$P 20 has opened relay switch 44 despite the fact that the inputs from the overfill sensor circuit 24 and the ground sensor circuit 26 indicate that fluid flow may commence.

Figure 4:
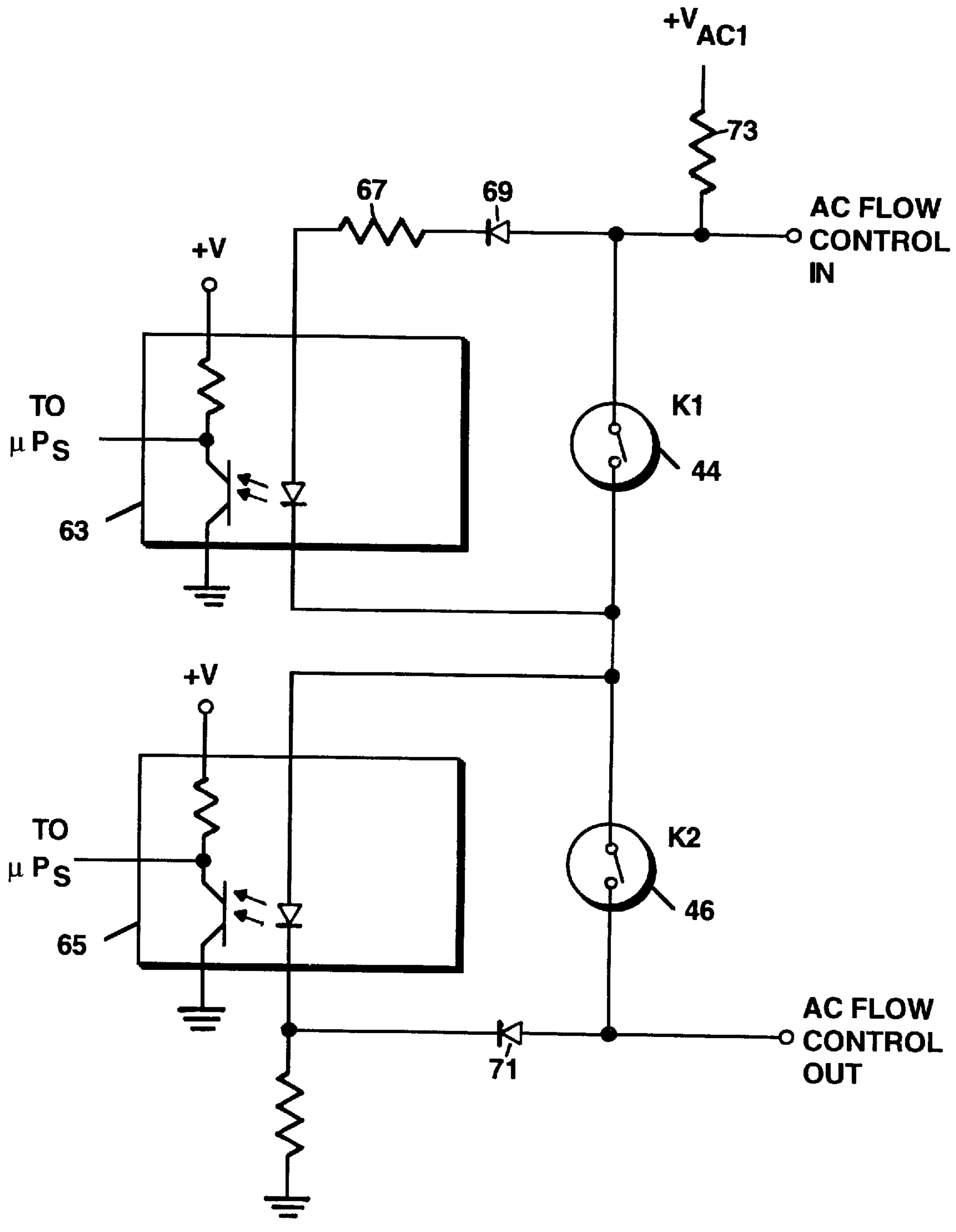
FIG. 4 is a schematic illustration of the relay sensing circuitry for a controller according to the present invention.

Shown in FIG. 4 is an detailed view of the relay sensing circuitry labeled in FIG. 3 as AC voltage sense 64 and AC voltage sense 66. Optoisolator 63 is positioned to detect the voltage developed across relay switch 44. The optoisolator 63 protects the microprocessors from electrical surges or short circuits from the high voltage AC signal being detected. In addition, current limiting resistor 67 is provided to protect the optoisolator 63. If the relay switch 44 is open, the detected alternating voltage causes the optoisolator to generate an alternating output signal having the frequency of the AC flow control signal. If the relay switch 44 is closed, the detected voltage is zero volts, and the output to the microprocessors 20, 22 is a DC signal of approximately five volts.

Optoisolator 65 detects the voltage across relay switch 46 in the same manner that optoisolator 63 detects the voltage across relay switch 44, and converts the detected relay signal into an output to the microprocessors 20, 22. If the relay switch 46 is open, the output is an alternating signal having the frequency of the AC flow control signal. If the relay switch is closed, the output is a DC signal of approximately five volts.

One notable feature of the relay detection shown in FIG. 4 involves the use of blocking diodes 69, 71. Diode 69 is a negative current blocking diode, and diode 71 is a positive current blocking diode. The arrangement of these diodes is such that the contact sensing current (i.e. that which is detected by the optoisolators 63, 65) is blocked from both the input and output ports of the flow control signal. Thus, there is no detectable voltage on the flow control contacts due to the sensing current. Furthermore, an internal AC signal $V_{AC1}$ is input via resistor 73 to the flow control input. This voltage is overpowered by the flow control input ordinarily, but provides a local source of detection current if the AC flow control signal is absent, so that the relay detection circuitry still functions.

The fluid transfer controller provided is fail-safe in that it provides not only redundant control but, with the monitoring of each relay activation and contact signals, a cross check of each microprocessor is performed by the other. Thus, no single-point hardware failure will cause the system to allow fluid transfer under a hazardous condition. As described below, the redundancy of the system is also extended to the firmware that drives the microprocessors.

To prevent a common software lockup which might cause both microprocessors to freeze under the same error condition, the firmware for each of the microprocessors is distinctly different, and uses different flow logic to accomplish tasks which are common to both microprocessors. The flow logic for the firmware of the main $\mu$P is depicted in FIGS. 5–9.

Figure 5:
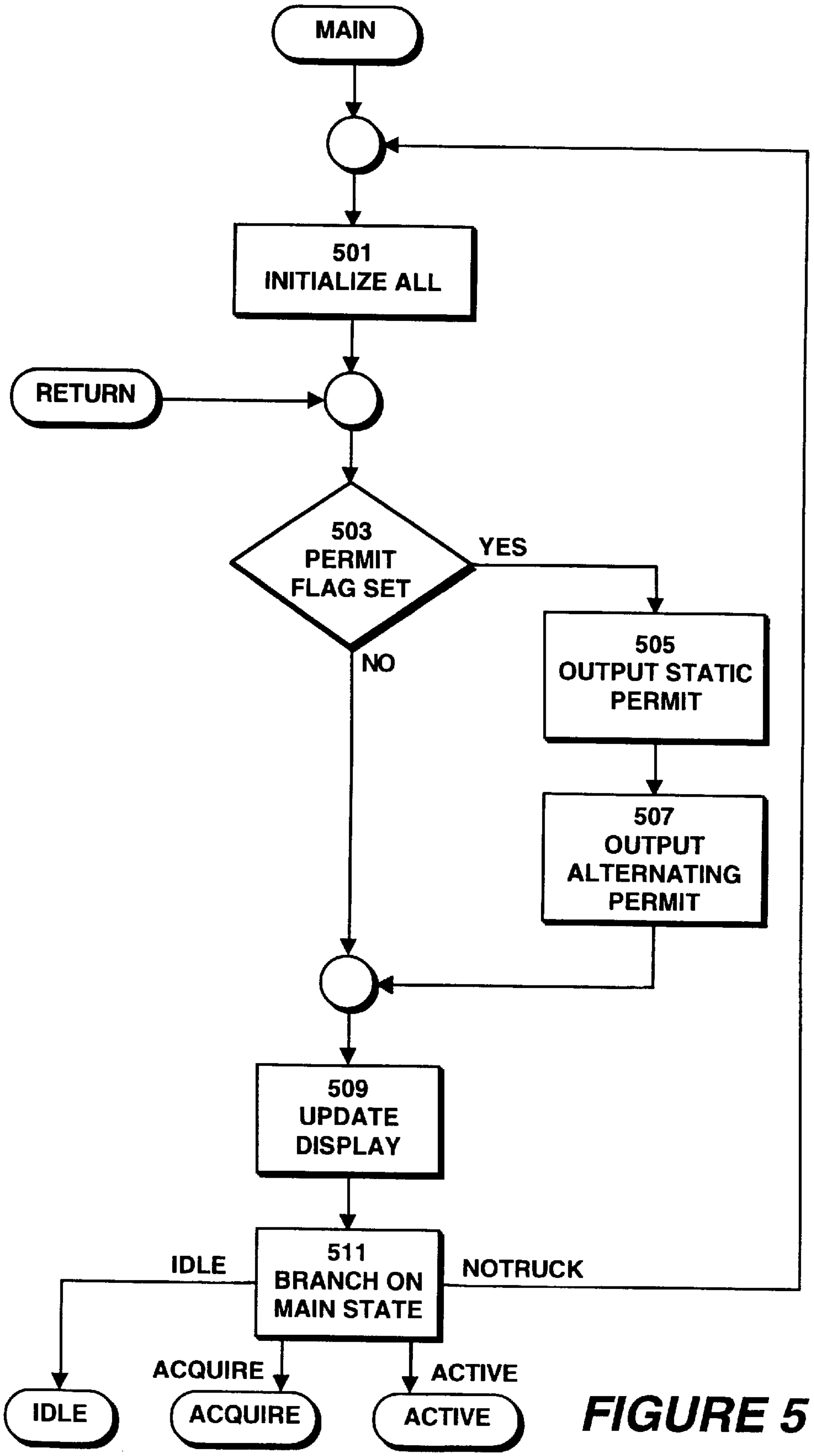
FIG. 5 is a flow diagram of a "Main" portion of the firmware of the main microprocessor of a fluid transfer controller according to the present invention.
Figure 6:
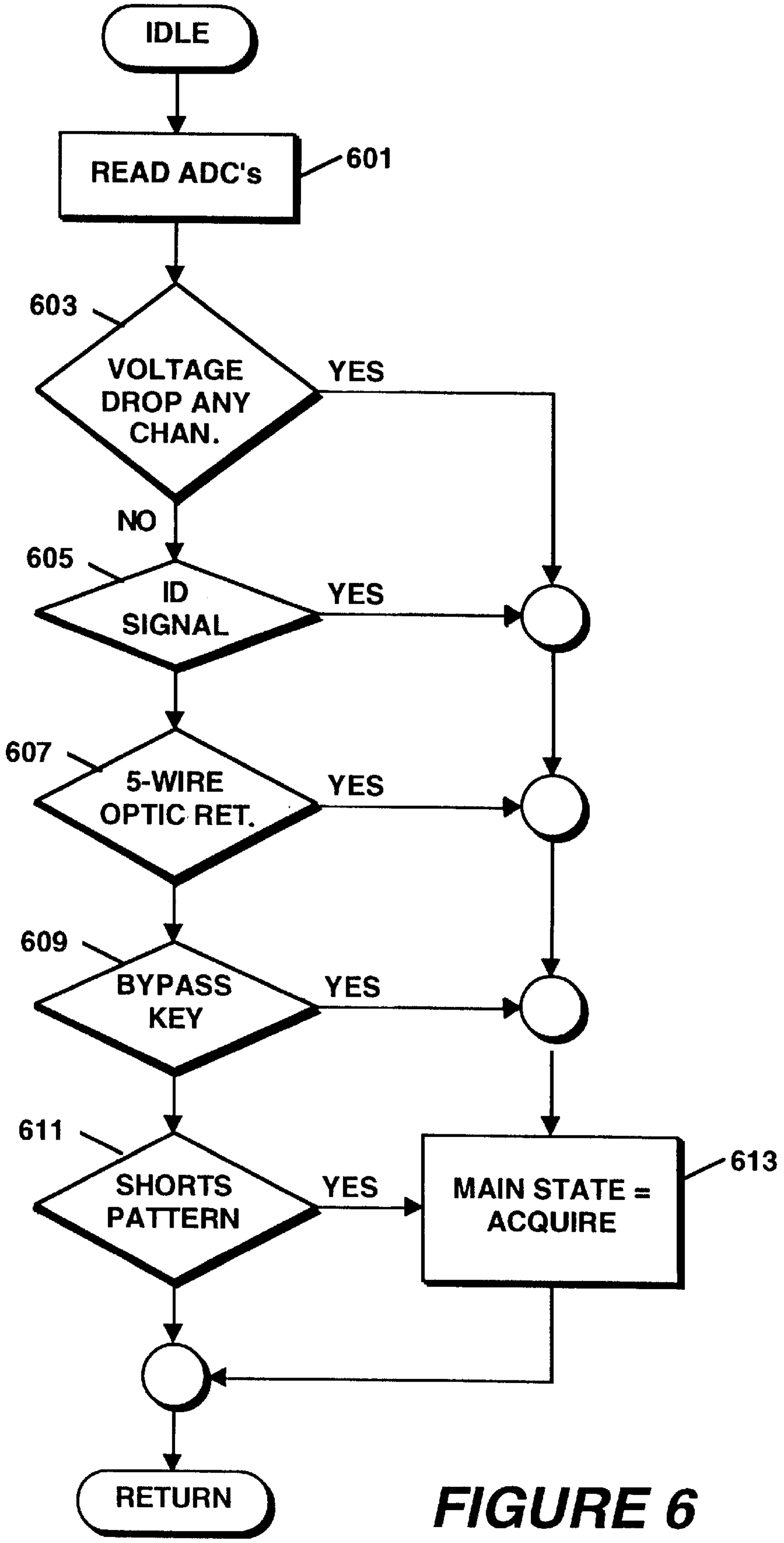
FIG. 6 is a flow diagram of an "Idle" portion of the firmware of the main microprocessor of a fluid transfer controller according to the present invention.
Figure 7:
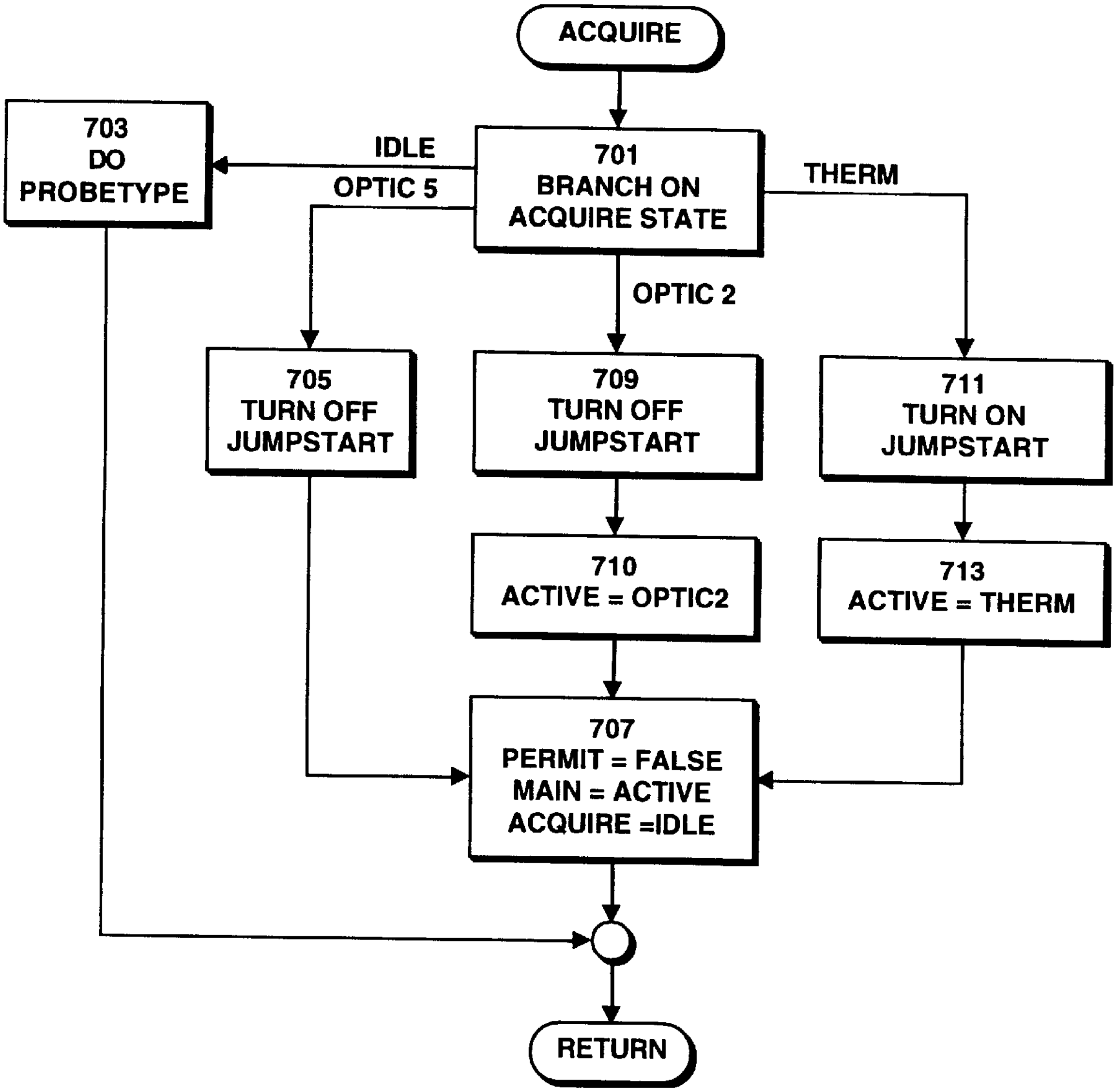
FIG. 7 is a flow diagram of an "Acquire" portion of the firmware of the main microprocessor of a fluid transfer controller according to the present invention.

The main $\mu$P 20 is driven by a program which consists of a number of branching instructions that direct the logic flow through the correct series of functions depending on the branching conditions. As shown in FIG. 5, the highest level of this program (the "main" portion) begins in step 501 by initializing all the necessary program variables. A "permit" flag is then tested in step 503 and, if it is set, the main $\mu$P outputs the static permit signal in step 505 and the alternating permit signal in step 507. The output to display panel 40 is then updated in step 509, and the program branches at step 511 to another section of the code based on the state of branch condition "MAIN."

Branching variable MAIN can take on one of four states, depending on the status of the controller input signals and the progress of the program flow logic. The four possible states of MAIN are "IDLE", "ACQUIRE", "ACTIVE" or "NOTRUCK". When the system is first initialized, MAIN is in state IDLE. Thus, upon reaching branching step 509, the program branches to the "IDLE" portion of the code, shown in FIG. 6.

In the "IDLE" program portion, the main $\mu$P 20 monitors inputs on the conductors of an input connector by which it is connected to any truck which is attempting to load fluid product via of the loading terminal at which the controller is located. Among these input signals are signals from the overfill detection probes supported by overfill circuit 24. Due to the existence of different types of overfill probes used in different trucks, the microprocessor must detect different types of overfill probe input signals. In general, all of the probes generate an oscillating signal when no overfill condition exists, but the oscillating signals have different parameters. Furthermore, "five-wire" type probes are series linked from compartment to compartment, while other "two-wire" type probes function independent of one another. In the program portion of FIG. 6, the digitized inputs signals are read by the microprocessor in step 601, and tested to determine whether there is a truck presently attached to the input connector.

Step 603 tests for a voltage drop on any probe channel consistent with attachment of any type of probe to one of the probe channels. Step 605 tests for a valid input signal from the ID sensor circuit 30. Step 607 tests for a valid return pulse from a five-wire optic type overfill probe. Step 609 tests for the presence of a signal from the optical bypass circuit 32 that is indicative of the of the use of a bypass key. Finally, step 611 tests for the presence of short circuit patterns on the input probe channels consistent with the short circuiting arrangement of some "on-truck" type probe control modules. Such modules are used on certain trucks to provide multiple types of output signals for use with different types of loading rack control monitors. The "two-wire" type outputs of these control monitors feature either a single or a dual output signal which is used to simulate either a six-compartment or an eight-compartment truck and, therefore, multiple probe channels appear shorted together.

If none of the signals tested for in steps 603, 605, 607, 609 and 611 are detected, the MAIN state remains IDLE. However, if any of these signals is present, the MAIN state is changed to "ACQUIRE" in step 613. The program flow then returns to the Main program of FIG. 5. Of course, as long as the MAIN state remains IDLE, the program continues to loop through the steps of FIG. 5 and FIG. 6. If the MAIN state has been set to ACQUIRE, however, step 511 of the Main program (FIG. 5) causes a branch to the Acquire portion of the program, depicted in FIG. 7.

Figure 8:
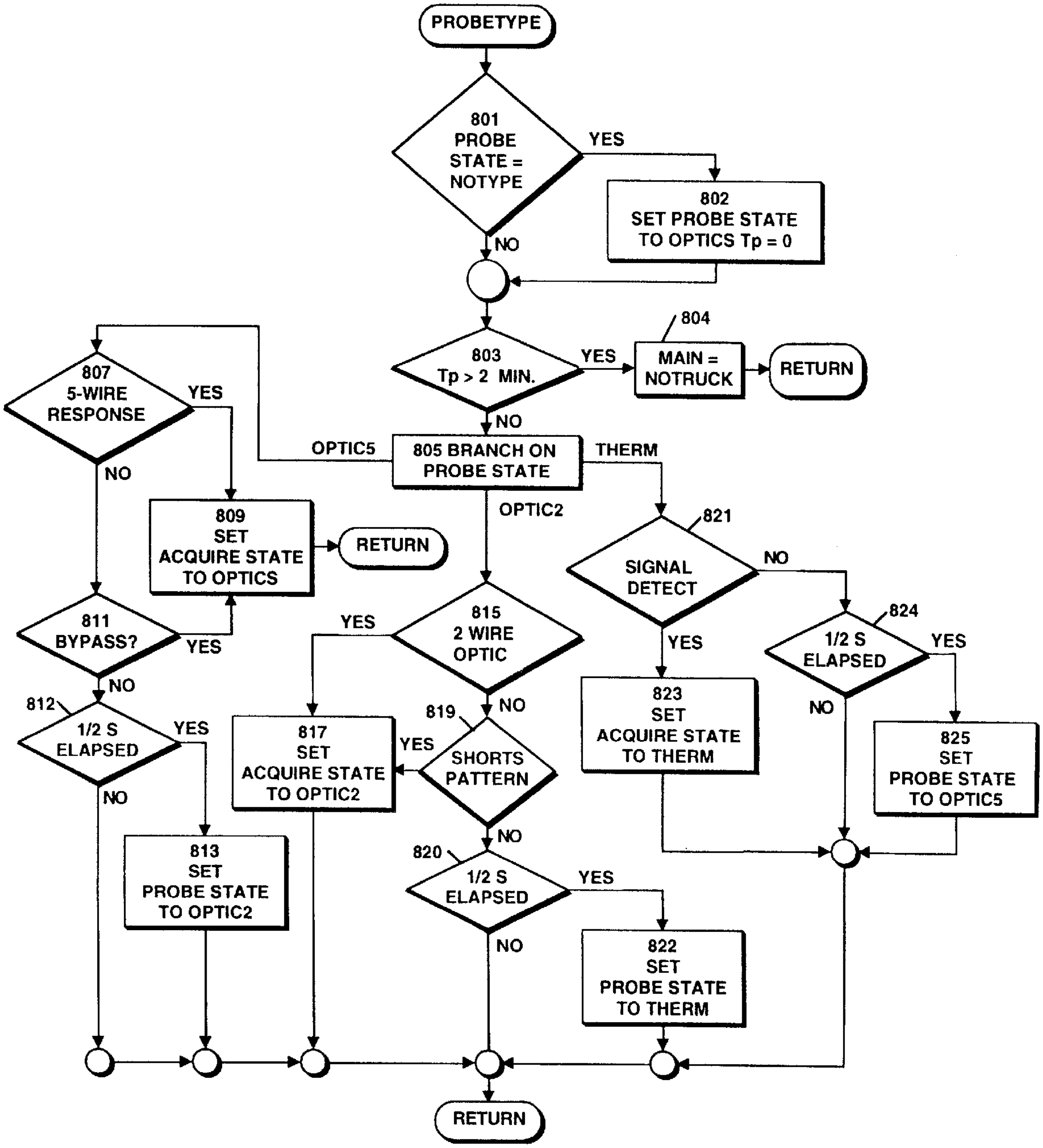
FIG. 8 is a flow diagram of a "Probetype" portion of the firmware of the main microprocessor of a fluid transfer controller according to the present invention.

Upon entering the Acquire portion of the program, the logic flow branches in step 701 based on the state of a branch variable ACQUIRE. The four possible states of ACQUIRE are "IDLE", "OPTIC5", "OPTIC2", and "THERM". Each of these states allows the activities of the program to be directed to the specific condition of the truck inputs. When the system is first initialized, ACQUIRE is set to IDLE. Thus, the program branches to step 703, in which subprogram PROBETYPE is executed. PROBETYPE is a detection program which verifies the type of overfill probe signals being detected by the main $\mu$P 20, and is depicted in FIG. 8.

The state of variable PROBE is used as a branching condition in the PROBETYPE subprogram. The four possible states of PROBE are "NOTYPE", "OPTIC5", "OPTIC2", and "THERM". When the system is initialized, PROBE is set to NOTYPE, indicating that no particular type of truck probe has yet been identified. The first time through the PROBETYPE flow, steps 801 and 802 set PROBE to OPTIC5 if the state of PROBE is NOTYPE. A timer for the PROBETYPE program portion, $T_p$ is also set to zero. In step 803, the value of $T_p$ is tested to determine if two minutes have elapsed since PROBETYPE was first entered. If so, it is determined that any truck which was thought to be present has either departed or can not be identified, MAIN is set to NOTRUCK in step 804, and control returns to the main program portion. If two minutes has not elapsed, the program flow proceeds to step 805 where it branches based on the state of PROBE.

If PROBE is set to OPTIC5, the program proceeds to step 807 and tests for the presence of a valid 5-wire optic return pulse. The testing for the pulse is limited to 0.5 second by step 812 which checks timer $T_p$ each time through the branch to determine whether 0.5 second has elapsed since entering the OPTIC5 branch. Since the period of valid 5-wire optic return pulses is significantly shorter than 0.5 second, a return pulse would be detected within the 0.5 second period if an 5-wire optic probe was present and dry (i.e. not in an overfill condition, which would prevent the receipt of return pulses). If a valid pulse is detected, the program flow proceeds to step 809, in which ACQUIRE is set to OPTIC5, and control returns to the main program. If a valid 5-wire pulse is not detected within the 0.5 second limit, step 811 tests for the presence of a valid bypass key input. If a bypass key is detected, the program proceeds to step 809, as above. If 0.5 second expires without a pulse detection, PROBE is set to OPTIC2 in step 813, and control is returned to the main program portion.

If a 5-wire signal was not detected, the next pass through the program logic results in a branch at step 805 to step 815, where the probe inputs are tested for the presence of a valid 2-wire optic pulse. The test for the pulse is limited to 0.5 second by step 820 which checks timer $T_p$ each time through the branch to determine whether 0.5 second has elapsed since entering the branch. The 0.5 second time limit is long enough to ensure that a 2-wire pulse would be detected if a dry two-wire optic probe was present on any of the channels.

If a valid pulse is detected, the program flow proceeds to step 817, where ACQUIRE is set to OPTIC2, and control returns to the main program. If no valid pulse is detected, and one minute has passed since entering the "Acquire" stage, the program proceeds to step 819, where the probe channels are tested for the presence of a short circuit pattern indicative of an on-truck control module. If the pattern is detected, the program proceeds to step 817, as above. If not, control returns to the main program portion. If the 0.5 second limit elapses, PROBE is set to THERM in step 822, and control returns to the main program.

When PROBE equals THERM, step 805 results in a branch to step 821, where the probe channels are tested for the presence of a valid thermistor probe signal. The signals which will be determined valid include those from both standard-style thermistor probes (e.g. Scully Signal Co. "Dynaprobe") and low temperature style thermistor probes (e.g. Scully Signal Co. "Uniprobe"). If such a signal is detected on any channel, ACQUIRE is set to THERM in step 823, and control returns to the main program portion. The signal detection time is limited to 0.5 second by step 824, which checks timer $T_p$ each time through the branch to determine whether 0.5 second has elapsed since entering the branch. If no such signal is detected after 0.5 second, PROBE is set to OPTIC5 in step 825, and control returns to the main program portion. Thus, in this manner, the program will continue to cycle through different branches of the PROBETYPE program portion for up to two minutes in an attempt to ascertain which type of probe signal caused the ACQUIRE portion of the program to be invoked.

Referring again to FIG. 7, a setting of ACQUIRE to OPTIC5 causes step 701 to branch to step 705, where the "jumpstart" function (discussed hereinafter) is disabled, and step 706 in which branching variable "ACTIVE" (discussed below with reference to FIG. 9) is set to "OPTIC5". In step 707, variable "PERMIT" is set to "FALSE", variable MAIN is set to ACTIVE, and variable ACQUIRE is set to IDLE. A setting of ACQUIRE to OPTIC2 upon entering the ACQUIRE portion of the program results in step 701 branching to step 709, in which the jumpstart function is disabled and step 710 in which ACTIVE is set to OPTIC2. The flow then proceeds to step 707, as above. A setting of THERM upon entering the ACQUIRE portion causes a branch from step 701 to step 711, in which the "jumpstart" function is initiated. The program then proceeds to step 713, in which ACTIVE is set to THERM, and to step 707, as above.

Figure 9A:
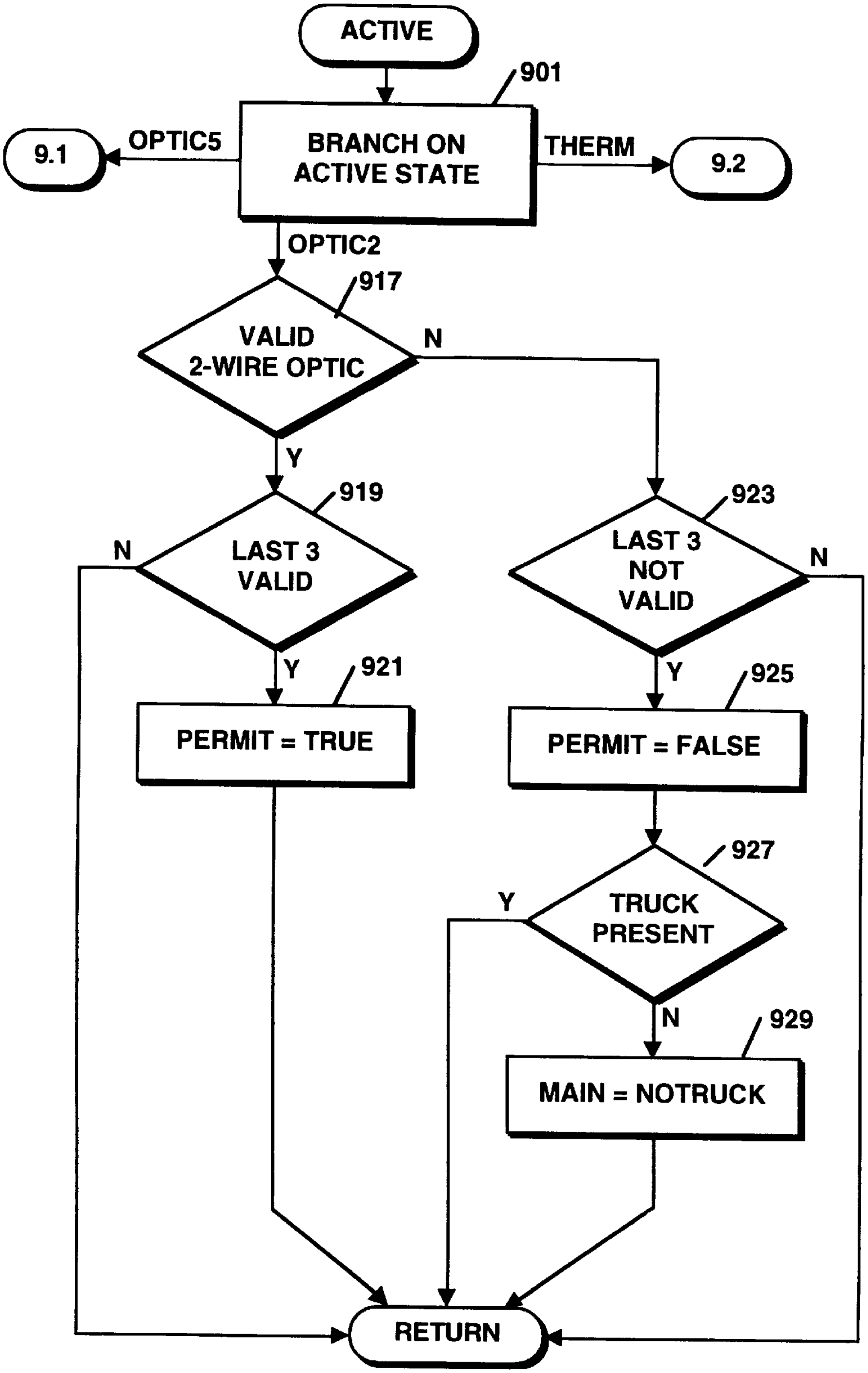
FIGS. 9A–9C depict a flow diagram of an "Active" portion of the firmware of the main microprocessor of a fluid transfer controller according to the present invention.
Figure 9B:
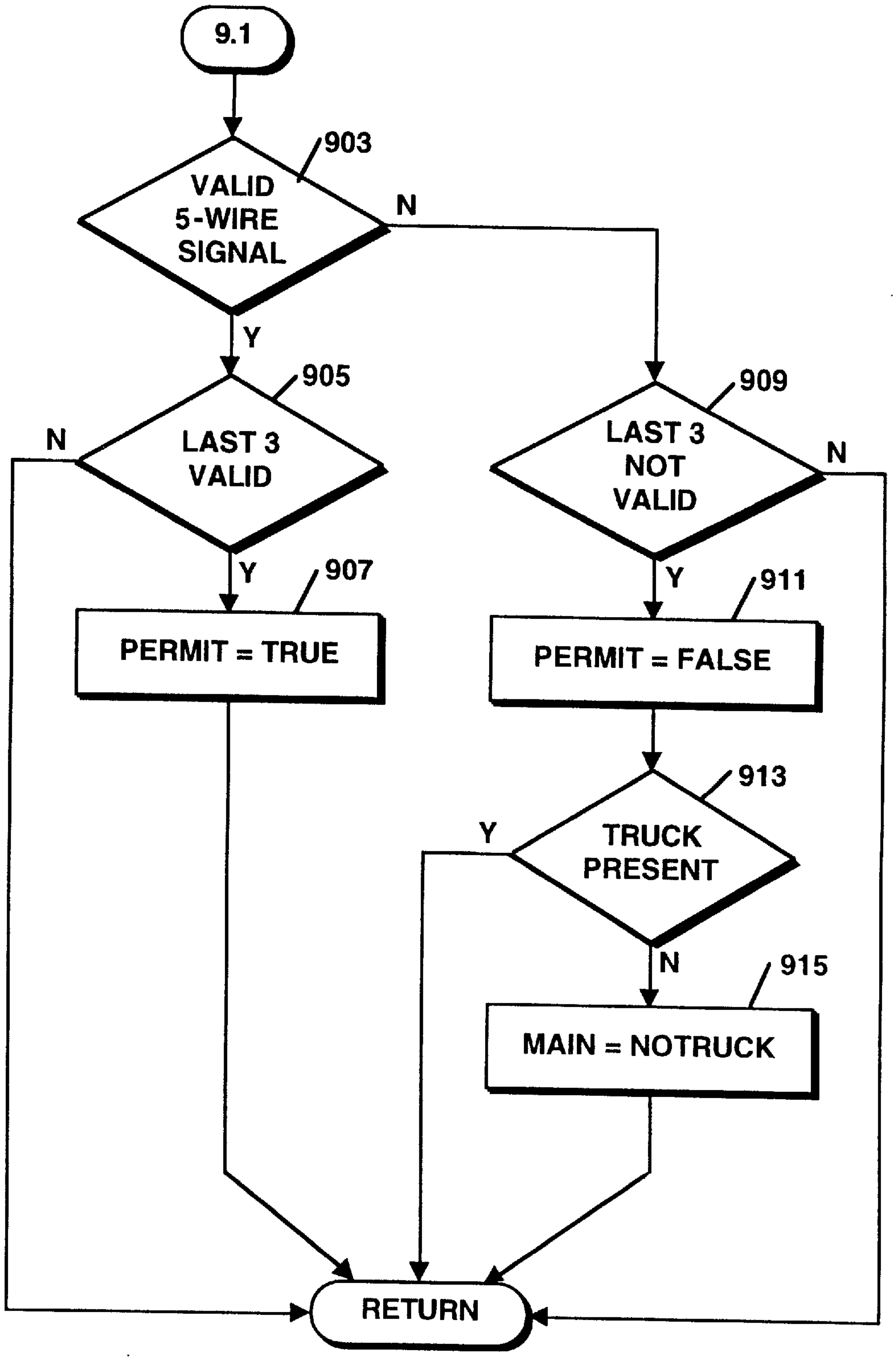
Figure 9C:
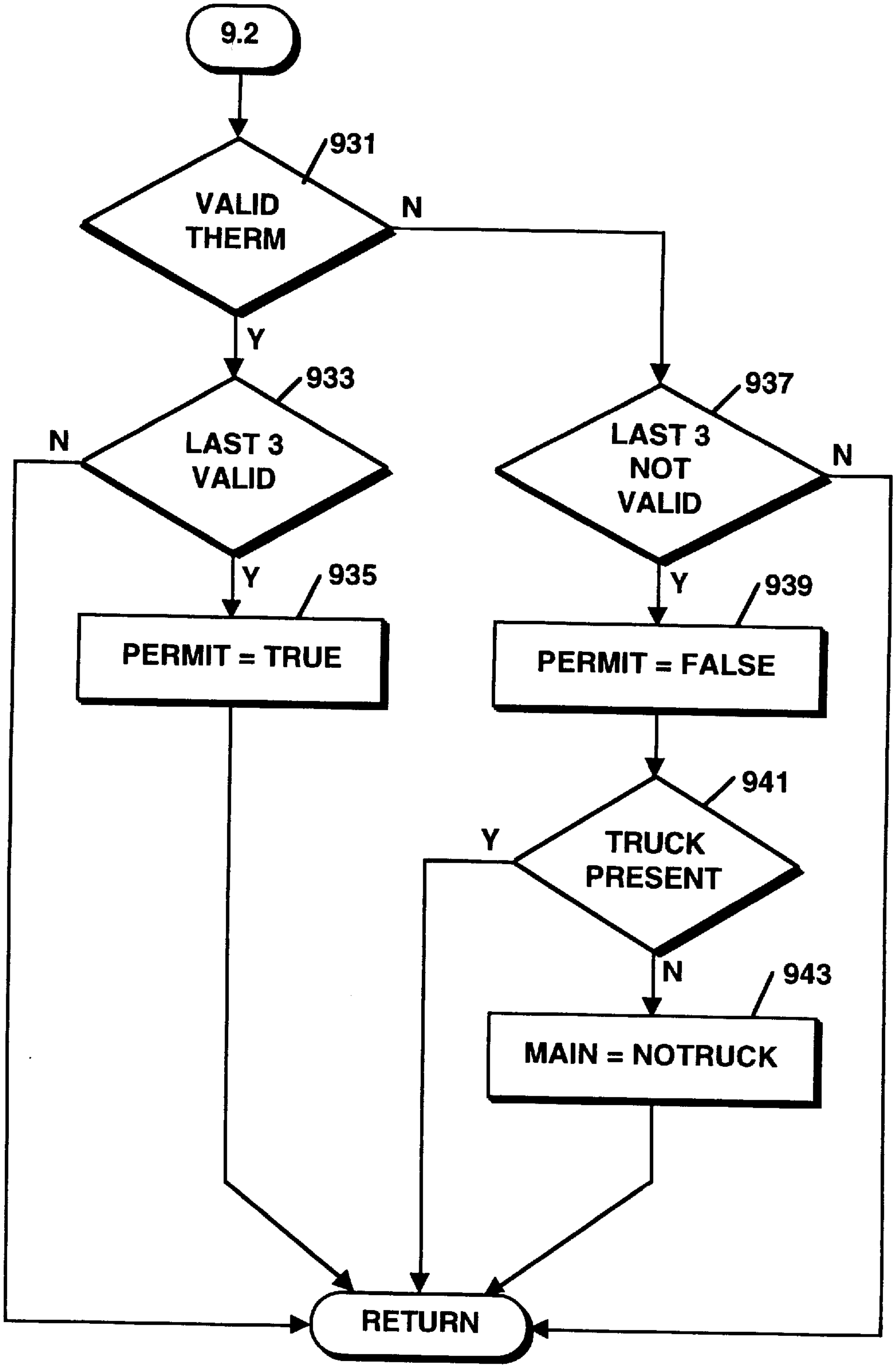

The "ACTIVE" portion of the program is shown in FIGS. 9A–9C. At step 901, the program branches based on the state of branching variable "ACTIVE". ACTIVE can be in any of the three states "OPTIC5", "OPTIC2", or "THERM".

When ACTIVE is set to OPTIC5, the probe channels (i.e. the digitized signals from the probes) are tested in step 903 (FIG. 9B) to determine whether a valid 5-wire optic return pulse is present. Additional detail regarding the particular signal testing is provided hereinafter in conjunction with FIGS. 13A and 13B. If a valid return pulse is detected, the program determines (in step 905) whether at least three consecutive valid pulses have been detected (the program maintains a record of the states of previous pulses). If three consecutive pulses were detected, then variable "PERMIT" is set to "TRUE" in step 907, thus allowing fluid transfer from the rack controller to the truck. If not, the program control returns to the main program portion.

If the result of the test in step 903 is that a valid return pulse has not been detected, then the program determines, in step 909, whether three consecutive tests have failed to detect a valid pulse. If fewer than three consecutive tests without a valid pulse have passed, the program control returns to the main program portion. If, however, at least three cycles have passed without a valid return pulse, PERMIT is set to "FALSE" in step 911, and the program tests for the presence of the truck in step 913. If the truck is still detected, the program returns to the main program portion. If the truck is no longer present, MAIN is set to NOTRUCK in step 915, after which control is returned to the main program portion. The presence of the truck is detected via the ground sensor circuit by determining that a valid ground exists, or by any load on the probe channels which lowers the channel voltage below open circuit voltage.

The OPTIC2 branch (FIG. 9A) and the THERM branch (FIG. 9C) of ACTIVE function in essentially the same way as the OPTIC5 branch, except that the detection parameters for the probe signals are different. In the OPTIC2 branch, the program determines whether a valid 2-wire optic signal has been detected on all active (i.e. either six or eight) probe channels in step 917. As in the OPTIC5 branch, the program then checks, if a valid set of pulses was detected, whether three in a row have been detected on each active probe channel (step 919), sets PERMIT to TRUE if so (step 921) and returns to the main program code. Similarly, the failure to detect a valid pulse results in a test of whether the last three tests have failed to detect a set of valid pulses (step 923) and, if so, PERMIT is set to FALSE (step 925). A test for the presence of the truck is conducted in step 927 and, if no truck is present, MAIN is set to NOTRUCK in step 929.

The THERM branch (FIG. 9C) also operates in essentially the same manner as the OPTIC5 branch. The program tests for a valid set of thermistor probe signals on all active probe channels in step 931. If a valid set of signals is detected, the outcomes of the last three tests are checked to determine if three valid sets of signals in a row have been detected (step 933). If so, PERMIT is set to TRUE in step 935, and control returns to the main program portion. If no valid signal is detected in step 931, the program checks to determine whether the last three tests also failed to detect a valid set of signals (step 937). If so, PERMIT is set to FALSE in step 939. The program then checks to determine whether a truck is still present (step 941) and, if not, MAIN is set to NOTRUCK in step 943 before control is returned to the main program portion.

Once the truck departs, and MAIN is set to NOTRUCK in one of the relevant program steps discussed above, the next pass through the main program portion (FIG. 5) results in a branch from step 511 to step 501, in which all of the system variables are reinitialized. This includes the initialization of all of the branching variables to the initial states which are mentioned above.

As mentioned above, the backup $\mu$P 22 uses firmware which is distinctly different, and which was written independently of the firmware for the main $\mu$P 20. In particular, the firmware of the backup pP uses an interrupt-driven sampling routine for sampling the probe signals. The firmware also makes use of the finite state machines (FSMs) which are regularly updated, and which track the state of various condition and variables of interest.

Shown in FIGS. 10A–10F is a flowchart describing the sampling interrupt routine used by the backup $\mu$P to sample the input channels from the overfill probes. All of the variables used by the interrupt routine are initialized as part of the backup main program described below in conjunction with FIG. 11. The FIG. 11 main program loops continuously through calling a "Probetype" finite state machine and a "Bypass" finite state machine, and is periodically interrupted by the interrupt routine. Each finite state machine is checked each time through the main program loop, and updated if necessary. The Probetype finite state machine therefore maintains the current state of the probes being detected (e.g. 5-wire wet, 5-wire dry, 2-wire wet, 2-wire dry), and this data is accessible to the interrupt routine.

Figure 10A:
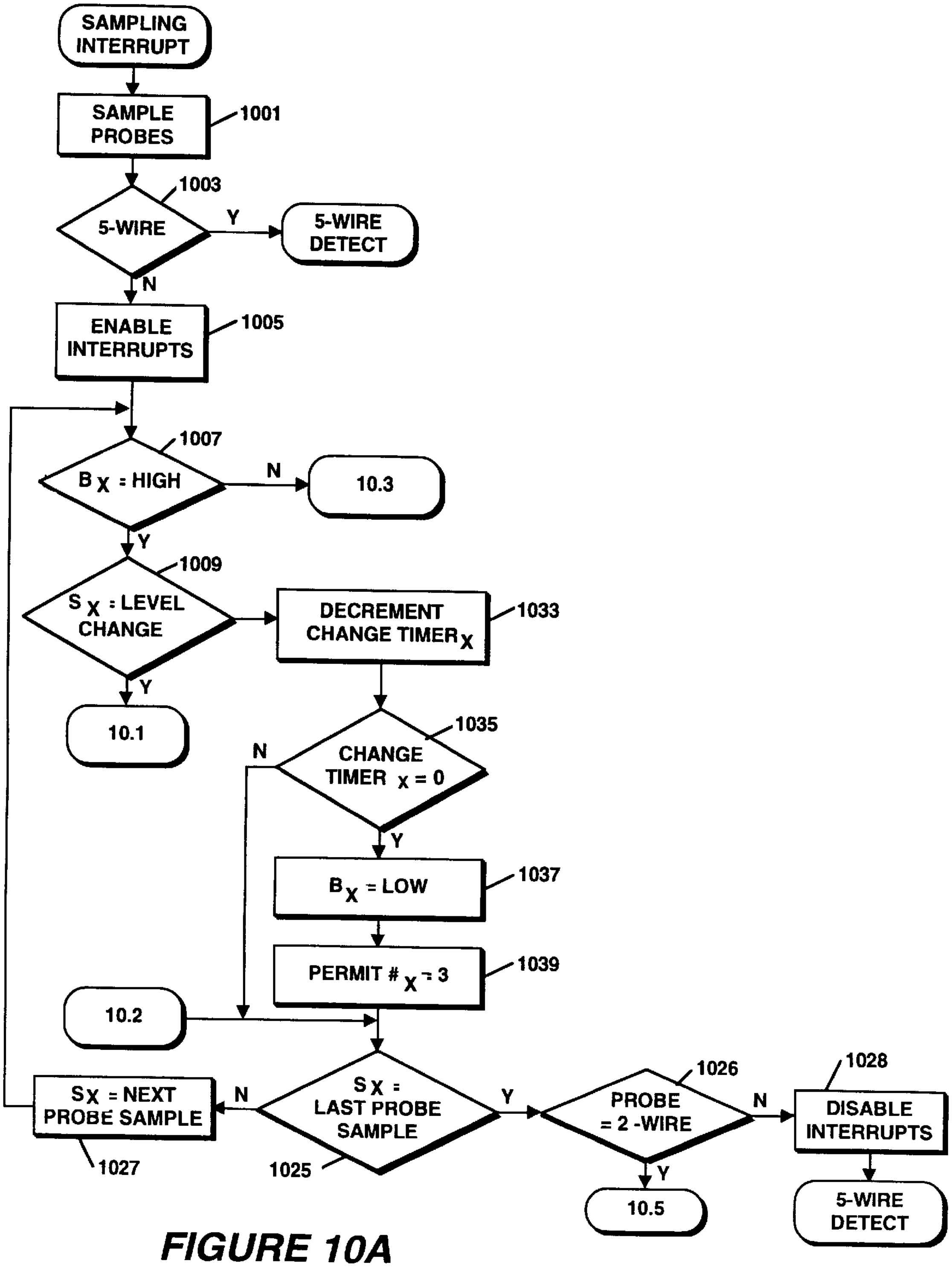
FIG. 10A–10F depict a flow diagram of a probe sampling interrupt routine which is part of the firmware of the backup microprocessor of a fluid transfer controller according to the present invention.
Figure 10B:
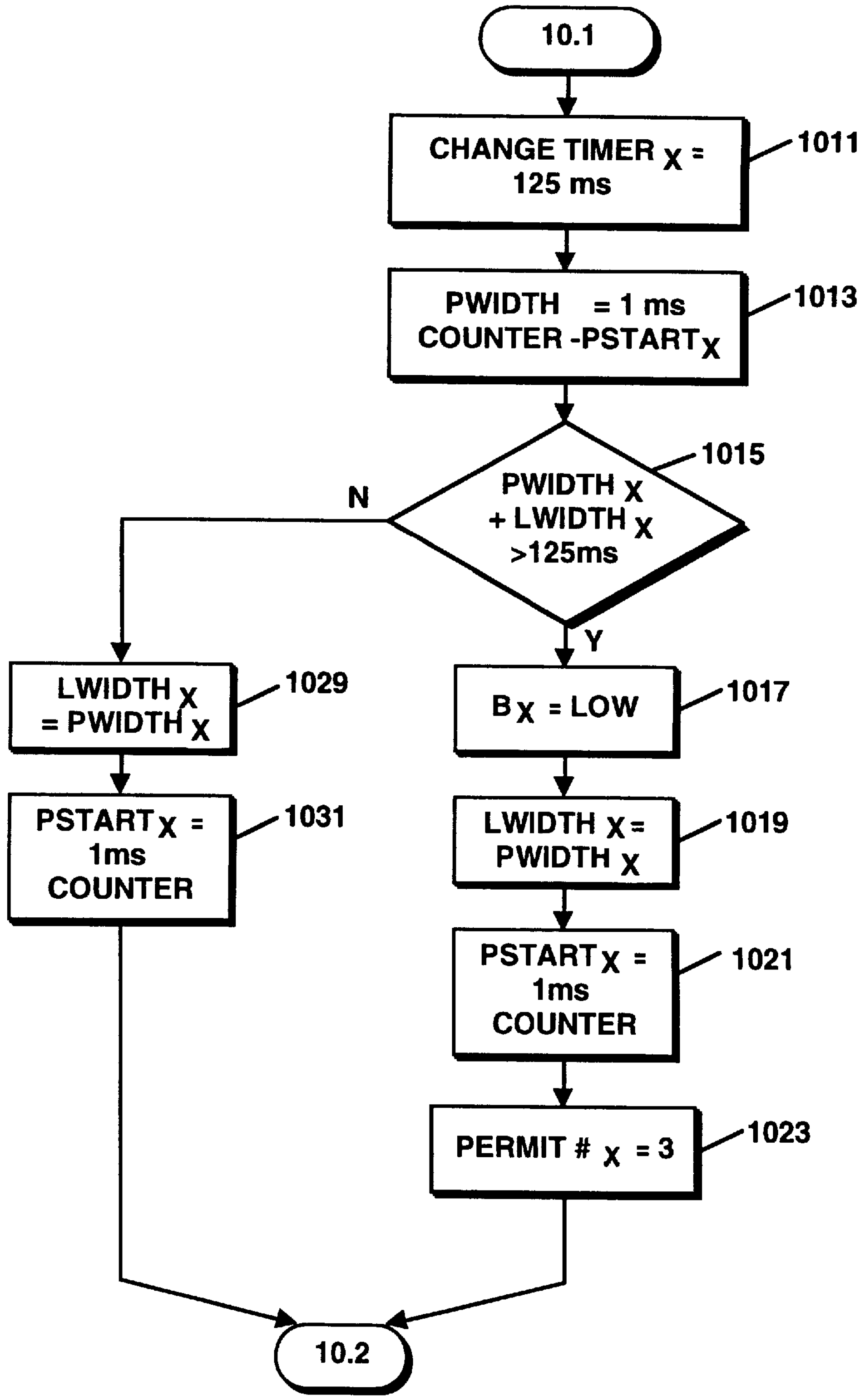

Referring to FIG. 10A, when the sampling interrupt routine commences, the probe channels are sampled in step 1001 using a comparator circuit (which is part of overfill sensor circuit 24) and which compares the signal value of each probe to a threshold value, and outputs a digital logic (one) or logic (zero) in response thereto. The threshold is set such that for a probe signal oscillating in the correct range, the output of the comparator circuit will change between a digital logic "one" and a digital logic "zero" as the probe signal changes between its maximum and minimum values. Sampling with the comparator is specifically intended for 2-wire type probes, which each individually output a signal on their own channel, and if the probes are determined to be 5-wire, the program branches from step 1003 to a 5-wire detection portion of the routine. In the preferred embodiment, this is determined by testing the state of the "Probetype" FSM described hereinafter. If the probes are not 5-wire, the interrupts are enabled in step 1005 and the main portion of the interrupt routine continues.

In step 1007, the "oscillating" bits for the sampled probe channels are tested. For each probe channel, a bit is used to indicate whether a signal level change has been detected. The bit is set high when it is determined that a signal level change has been detected on the channel in question. The bit is set low when it is determined that no signal level change has been detected on the channel in question. At step 1007, the bit $B_x$ (x indicating that it is the bit corresponding to the probe channel for which a current sample $S_x$ is to be processed) is tested to determine whether the current probe channel was oscillating when last tested. If not, the program proceeds to the portion of the routine shown in FIG. 10A. If the bit is set high, the routine proceeds to step 1009, where the current sample is tested against the previously sampled value of that probe channel saved from the last execution of the interrupt routine.

If the sampled voltage level has changed from the last execution of the routine, flow proceeds to step 1011 (FIG. 10B) in which a "change" timer (labeled "change timer$_x$" to indicate that a different change timer exists for each sampled probe channel) is set to a maximum of 125 ms. The change timer is a counter which establishes a maximum time within which a full oscillation cycle (i.e. three voltage level changes) must be detected to be considered valid. In step 1013, the variable "PWIDTHX" is then set to the value of the difference between a "1 ms" counter and variable "PSTART$_x$". The 1 ms counter is a timer which initiates the interrupt routine, and which is incremented once every millisecond. PSTART$_x$ is a variable which contains the time of the last detected level change. Thus, variable PWIDTH$_x$ contains the duration of the most recently detected pulse (i.e. the time difference between the last two detected level changes).

In step 1015, the sum of PWIDTH$_x$ and variable "LWIDTH$_x$" (the last previous value for PWIDTH$_x$ is tested to determine if it exceeds 125 ms. In other words, the durations of the last two pulses (equaling a full oscillation cycle) are summed and tested against the 125 ms limit. It will be understood that, since the pulses are being identified by level changes (and not just "rising edges"), that they include "low" pulses as well as "high" pulses, and that two consecutive pulses therefore makes up one oscillation cycle of the probe signal. (The 125 ms limit corresponds to the eight Hertz minimum probe frequency requirement for each channel).

Figure 1:
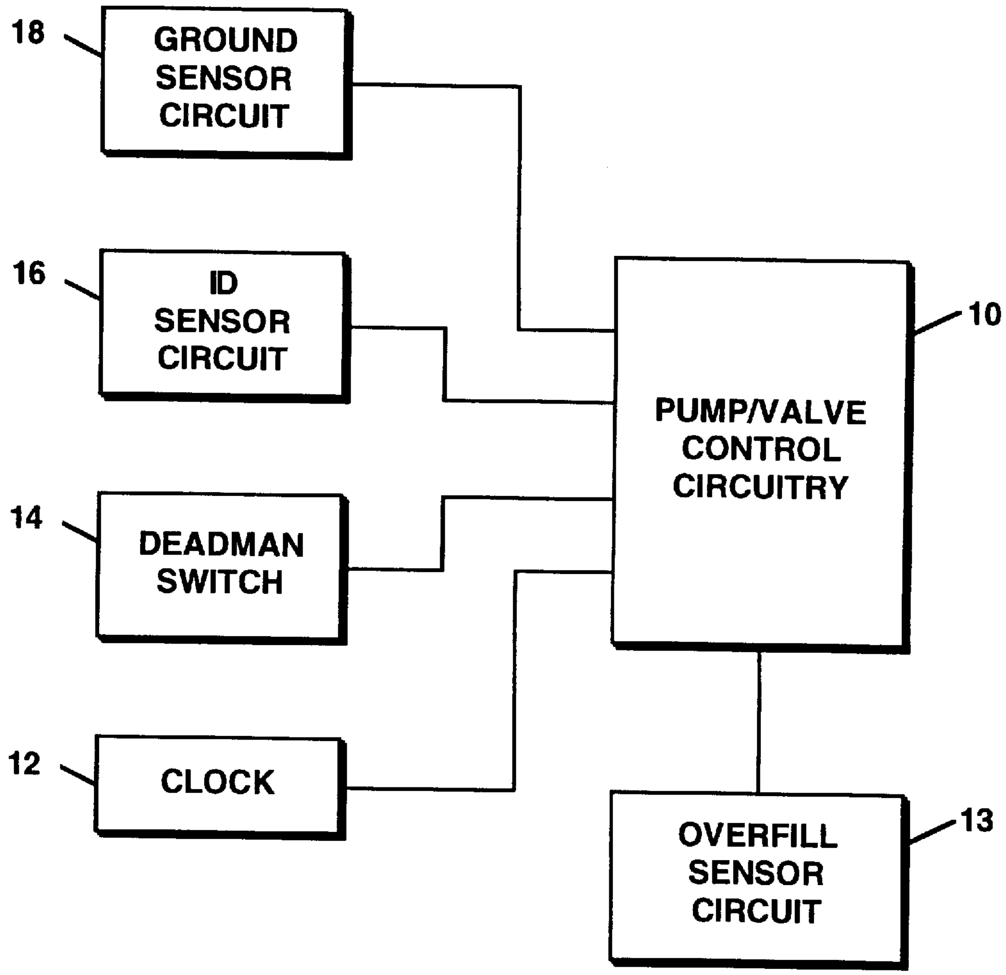
FIGURE 1 PRIOR ART
FIG. 1 is a block diagram of a prior art fluid transfer controller.

If the sum of the consecutive pulse durations exceeds the 125 ms limit, the probe signal is considered invalid, and the oscillating bit $B_x$ for that probe channel is set low in step 1017. To prepare for the next interrupt cycle, LWIDTH$_x$ is set to PWIDTH (step 1019), PSTART$_x$ is set to the value of the 1 ms counter (step 1021), and "PERMIT#$_x$" (a variable indicating the remaining number of successful tests of PWIDTH$_x$+LWIDTH$_x$ required to allow a PERMIT condition) is set to three (step 1023). The routine then determines, in step 1025 (FIG. 1A), whether each of the probe samples has been tested and, if not, gets the next probe sample in step 1027 and returns to step 1007. If, in step 1015 (FIG. 10B), the sum of the last two pulses is less than 125 ms, LWIDTH$_x$ is set to PWIDTH$_x$ in step 1029, PSTART$_x$ is set to the value of the 1 ms counter in step 1031, and the routine proceeds to step 1025 (FIG. 10A).

Referring back to step 1009, if no level change is detected for the probe channel in question during this execution of the interrupt routine, the change $timer_x$ is decremented in step 1033. The change $timer_x$ is then tested in step 1035 to determine whether it has yet reached zero (indicating no level change within 125 ms). If not, the routine proceeds to step 1025. If so, $B_x$ is set low in step 1037, PERMIT#$_x$ is set to three in step 1039 and the routine proceeds to step 1025.

Figure 12A:
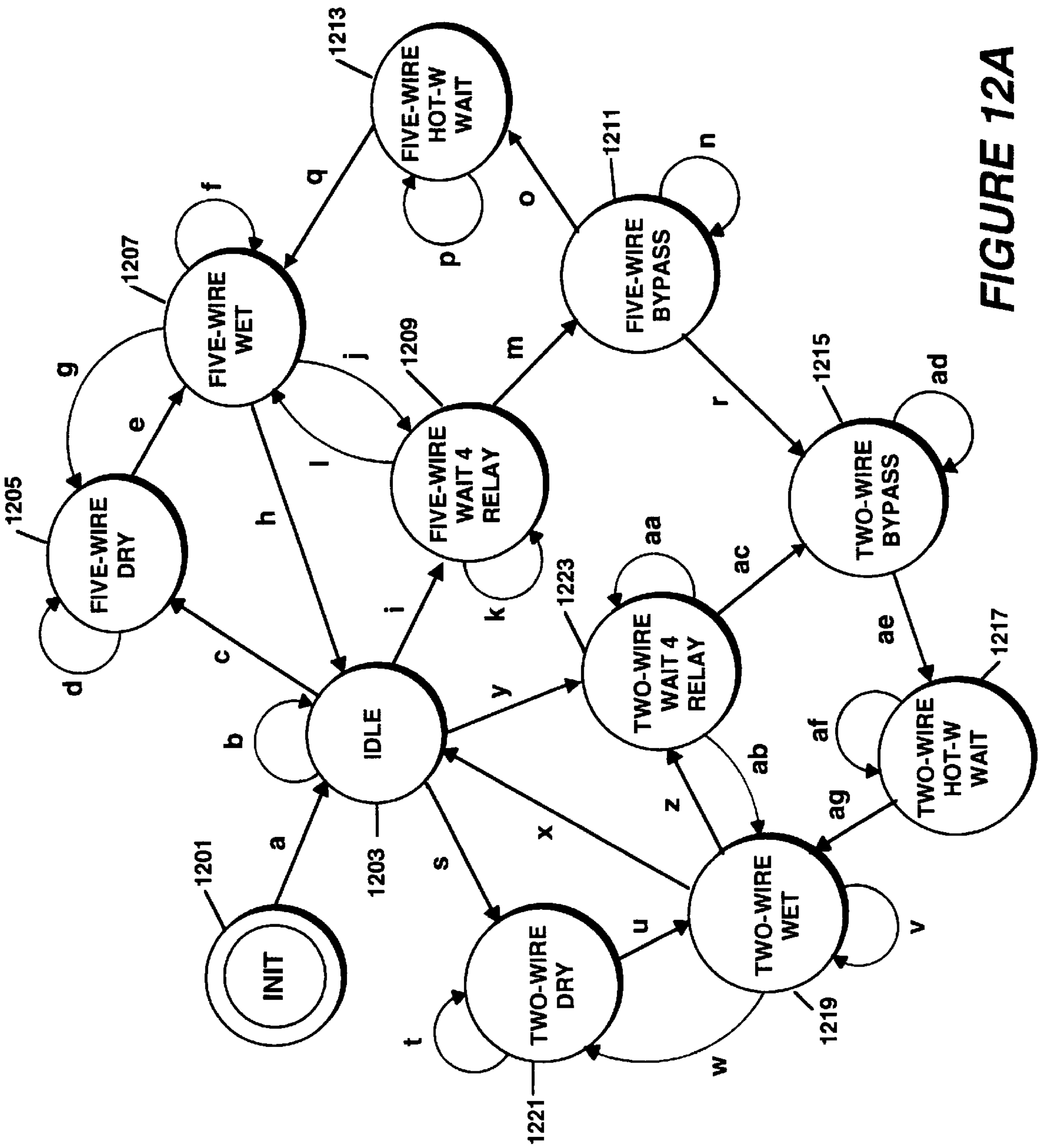
FIG. 12A is a state diagram depicting a "Probetype" finite state machine used by the firmware of the backup microprocessor of a fluid transfer controller according to the present invention.

If, in step 1025, the current sample is the "last sample", the routine proceeds to step 1026, in which the probe type is tested to determine whether the current probes are 2-wire probes. This determination is made by checking the current state of the Probetype finite state machine (FIG. 12A). If the probe is a 2-wire probe, the interrupt routine proceeds to a relay control portion of the routine (shown in FIG. 10E, and discussed hereinafter). If the probe type is not a 2-wire probe, interrupts are disabled in step 1028, and the routine proceeds to the 5-wire detection routine (FIG. 10F).

Figure 10C:
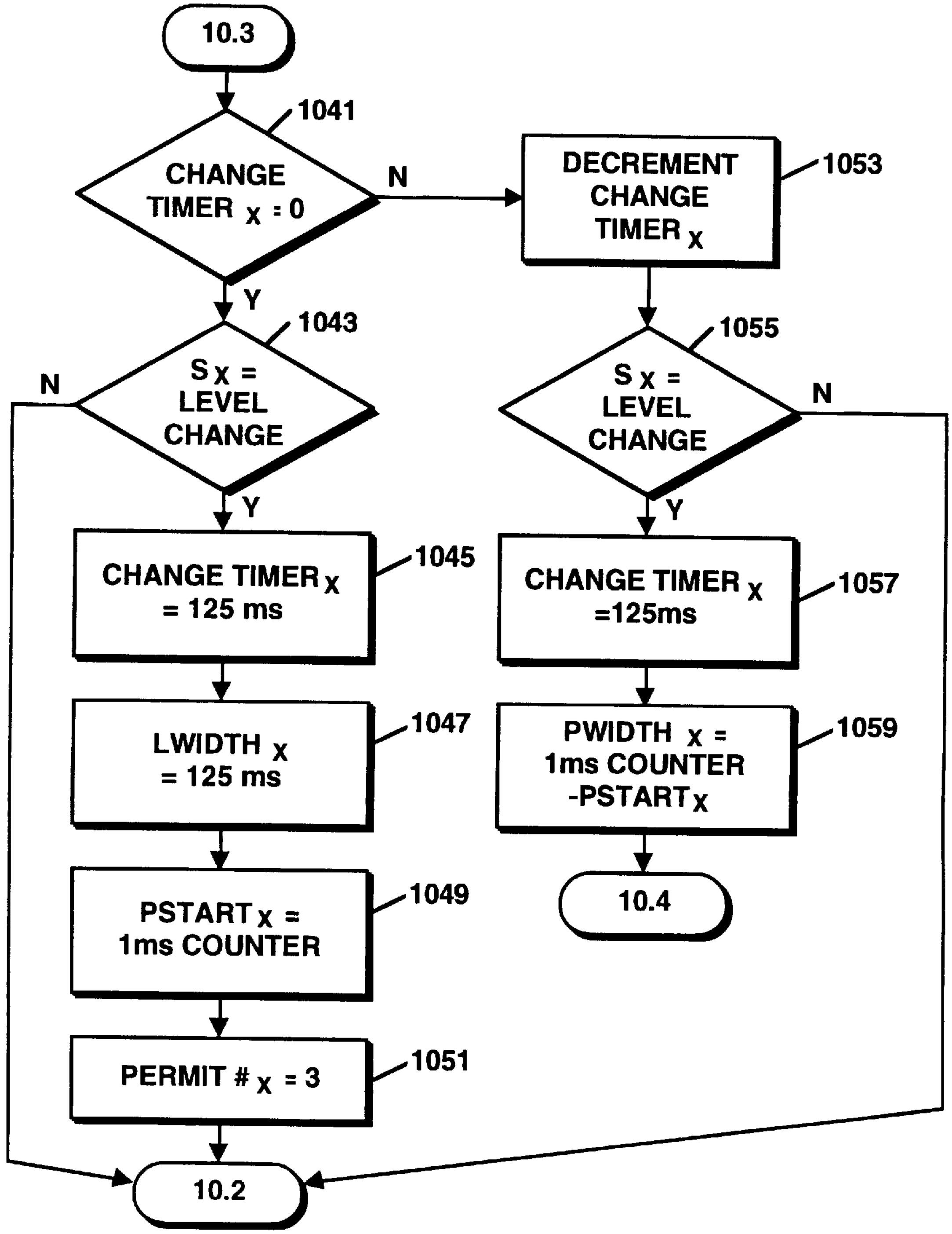
Figure 10D:
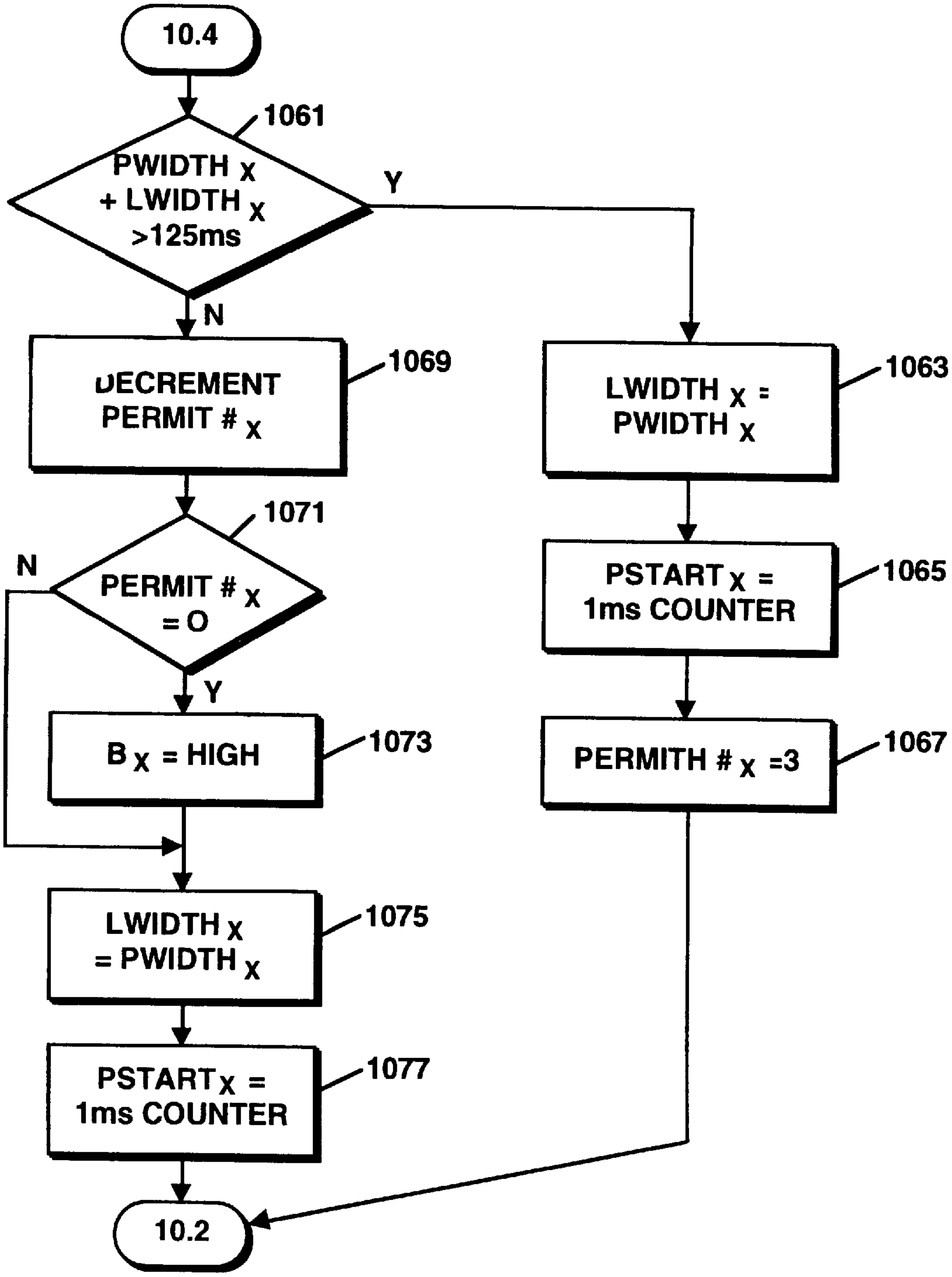

If the testing of the oscillating bit for the current probe channel in step 1007 indicates that the bit is set low, the routine proceeds to step 1041 (FIG. 10C). Step 1041 tests whether the change $timer_x$ has expired and, if so, the current sample is examined in step 1043 to determine whether a level change has occurred. If there is no level change, the routine returns to step 1007 (FIG. 10A). If there is a level change, the change $timer_x$ is set to 125 ms in step 1045, $LWIDTH_x$ is set to 125 ms in step 1047, $PSTART_x$ is set to the value of the 1 ms counter in step 1049 and PERMIT#$_x$ is reset to 3 in step 1051. Control is then returned to step 1007 (FIG. 10A).

If in step 1041, the change $timer_x$ has not yet reached zero, the change $timer_x$ is decremented in step 1053. The current probe sample is then tested in step 1055 to determine whether a level change has occurred. If not, the routine returns to step 1007 (FIG. 10A). If a level change has occurred, the change $timer_x$ is reset to 125 ms in step 1057, and $PWIDTH_x$ is set equal to the difference between the 1 ms counter and $PSTART_x$ in step 1059. The routine then proceeds to step 1061 (FIG. 10D) where the sum of the last two pulse durations ($PWIDTH_x$ and $LWIDTH_x$) is tested to determine whether it exceeds the 125 ms limit.

If the duration of the two pulses exceeds 125 ms, $LWIDTH_x$ is set equal to $PWIDTH_x$ in step 1063, $PSTART_x$ is set equal to the value of the 1 ms counter in step 1065 and PERMIT#$_x$ is reset to three in step 1067. Control is then returned to step 1007 (FIG. 10A). If the total duration of the two pulses is less than 125 ms, the routine proceeds from step 1061 to step 1069, where PERMIT#$_x$ is decremented. PERMIT#$_x$ is then tested in step 1071 to determine whether it has reached zero (i.e. whether three full cycles of valid oscillation have been detected). If so, the oscillating bit $B_x$ of the current probe is set high in step 1073, indicating that a valid oscillation is present on that probe channel. If $PERMIT_x$ has not reached zero, step 1073 is omitted. The routine then proceeds to step 1075, in which $LWIDTH_x$ is set equal to $PWIDTH_x$ and to step 1077, in which $PSTART_x$ is set equal to the value of the 1 ms counter. Control is then returned to step 1007 (FIG. 10A).

Figure 10E:
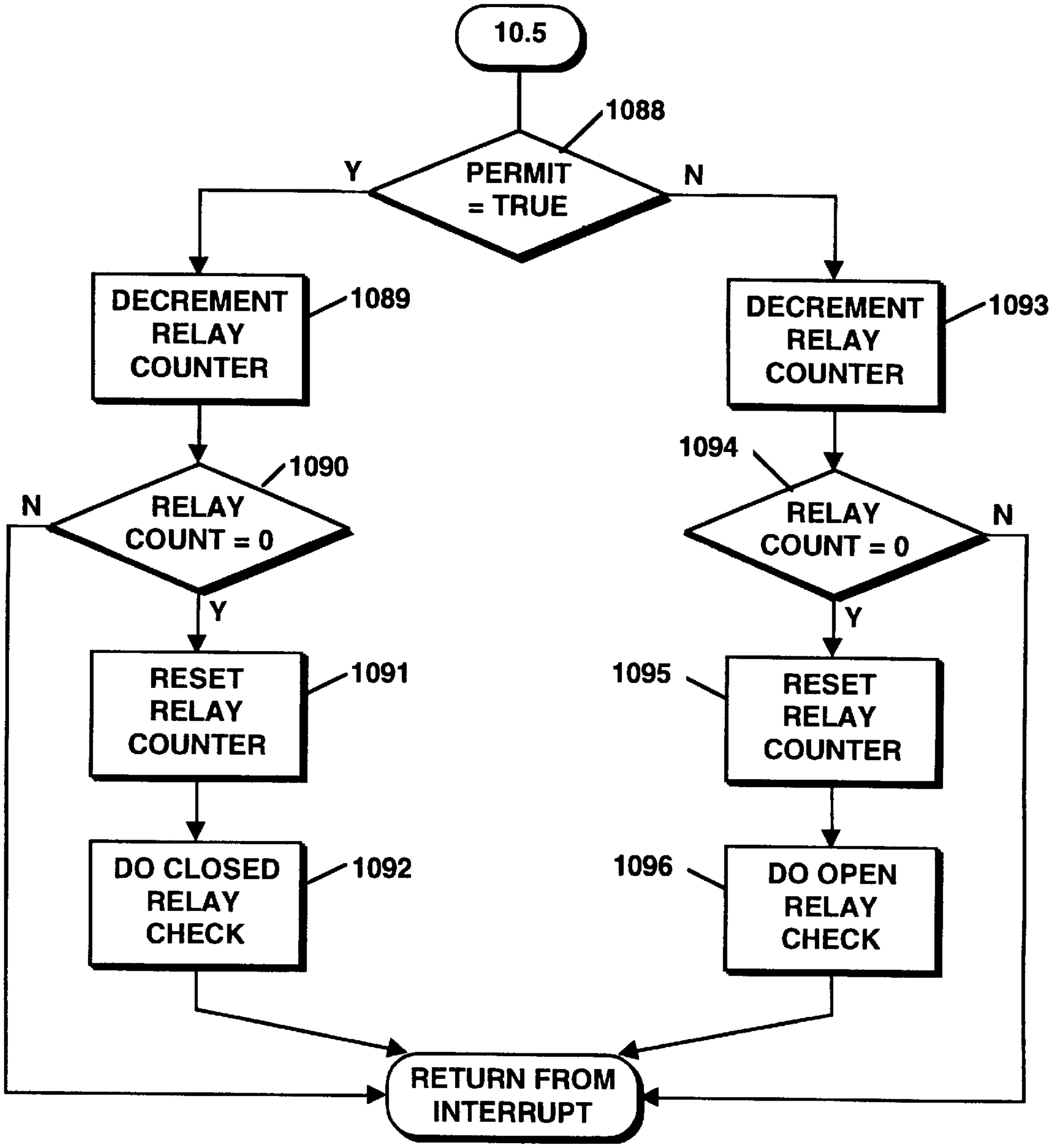
Figure 10F:
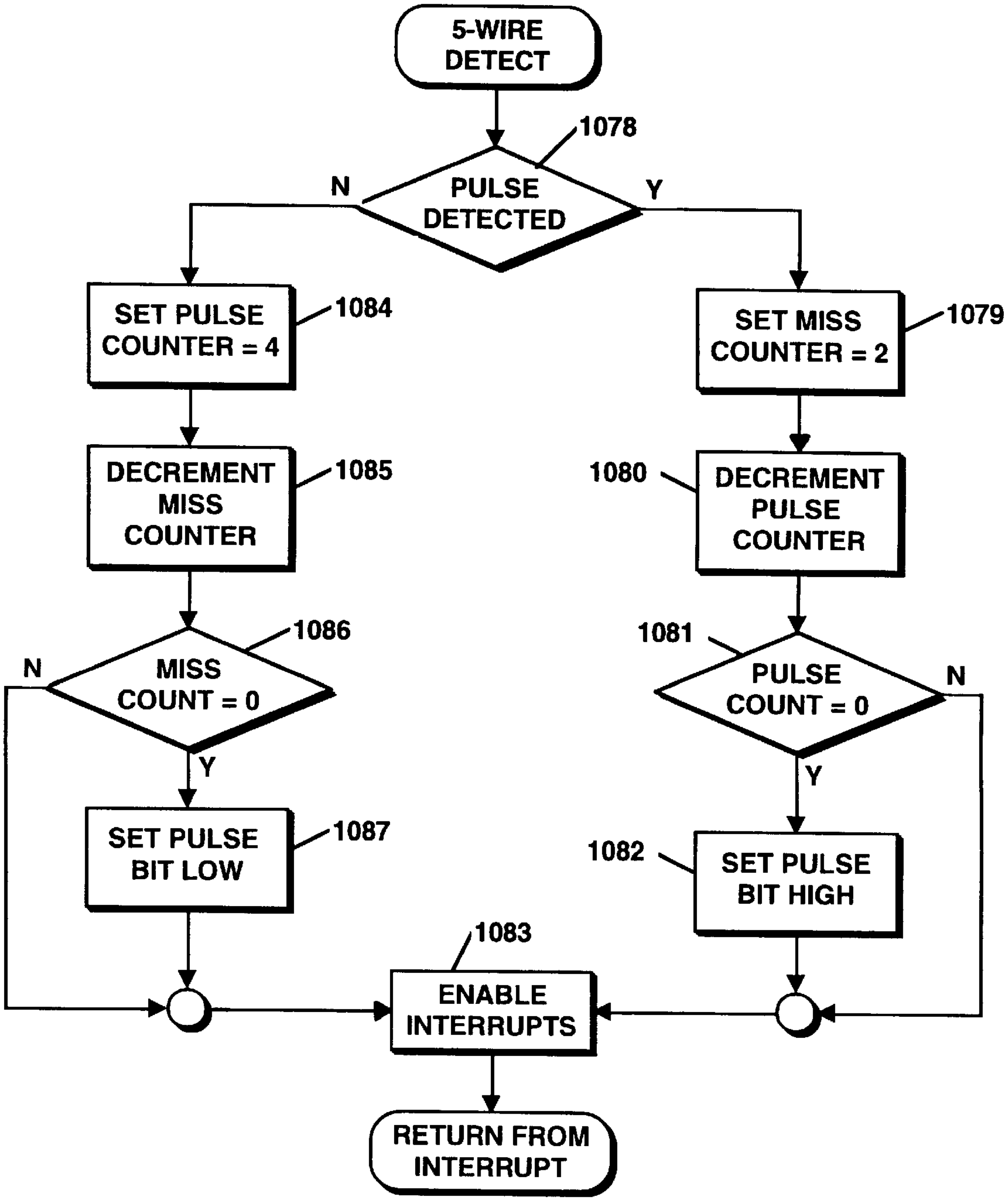
Figure 11:
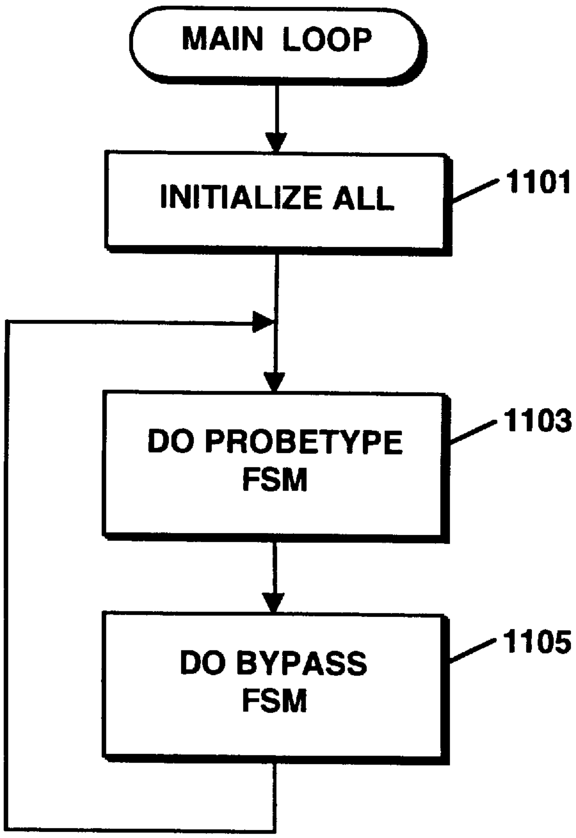
FIG. 11 is a flow diagram of a main firmware program of the backup microprocessor of a fluid transfer controller according to the present invention.

The relay control portion of the interrupt routine is depicted in the flowchart of FIG. 10E. When the probes are determined to be 2-wire probes in step 1026 (FIG. 10A), the routine proceeds to step 1088, in which the program tests the current state of variable "PERMIT" to determine whether the backup μP is already set to permit fluid transfer (i.e. is outputting the "static permit" and the "alternating permit" output signals such as to close relay switch 46). If PERMIT is set to true (i.e. fluid flow is permissible), a "relay counter" is decremented in step 1089. The relay counter is used to periodically initiate a test of the relays being monitored by the backup μP. In step 1090, the relay count is then tested to determine whether it has reached zero. If not, the interrupt routine ends, and control returns to the main program (FIG. 11). If the relay count has reached zero, the program proceeds from step 1090 to step 1091, where the relay counter is reset, and to step 1092, where a "closed relay" test is performed. In this test, the "main relay monitor", "backup relay monitor", and "main charge monitor" input signals are examined by the backup μP 22 are examined to determine whether the states of the relays correspond to the states of the probe inputs. The results of this test are then stored, and the interrupt routine ends. During the next execution of the Probetype FSM (described hereinafter) the state machine will use the results of this test to update its state, if necessary.

If the test of the PERMIT variable in step 1088 indicates that PERMIT is false, the program proceeds to step 1093, at which the relay counter is decremented. The relay count is then tested in step 1094 and, if it has not reached zero, the interrupt routine ends. If the relay counter has reached zero, the counter is reset in step 1095, and an "open relay" test is performed in step 1096. The result is then stored and the interrupt routine ends. During the next execution of the Probetype FSM, the FSM will detect the stored result of the relay test, and will update itself, if necessary.

The subprogram for 5-wire detection is shown in FIG. 10F. Upon entering, probe channel four is examined in step 1078 to determine whether the main μP has transmitted a 5-wire output pulse and, if so, whether a valid return pulse was received. In a typical 5-wire optical probe arrangement, the overfill probes of the different truck compartments are in series, such that a return pulse is present on channel six only if all of probes are operating properly and are not in an overfill condition. If a valid return pulse is detected, the program proceeds to step 1079 where a "miss" counter is reset to 2. The miss counter is a decrementable counter which is initialized to two, and which is used to keep track of how many consecutive tests in step 1078 have resulted in no detection of a valid pulse. Since a valid pulse was detected, the miss counter is reset to two in step 1079.

From step 1079, the program proceeds to step 1080, where a "pulse" counter is decremented. Essentially the opposite of the miss counter, the pulse counter (originally initialized to four) is decremented each time a valid pulse is detected in step 1079. The pulse counter is tested in step 1081 and, if it has reached zero, a "pulse" bit is set high in step 1082. The pulse bit is used as an indicator to the system that, if it is set high, the proper probe signals are being detected. The Probetype FSM monitors this bit, and uses it to determine whether to enter a "5-wire dry" state. Interrupts are once again enabled in step 1083, and the interrupt routine terminates.

If, in step 1078, a pulse is not detected, the pulse counter is set to four in step 1084, and the miss counter is decremented in step 1085. The miss count is then tested in step 1086 to determine whether it has reached zero. If it has, the pulse bit is set low in step 1087 but, if it has not, step 1087 is omitted. Interrupts are then enabled again in step 1083, and the interrupt routine terminates. Thus, it can be seen that the pulse counter and the miss counter function as a type of "hysteresis" for preventing a spurious signal from causing a premature change between the permitting and the non-permitting states.

The main control program of the backup μP is described by the flow diagram of FIG. 11. This program is subject to interrupts by the sampling interrupt routine of FIGS.

10A–10F, and calls the finite state machines (FSMs) of the backup μP which are described in more detail hereinafter. In step 1101, all variables and other aspects of the program are initialized, as is conventional in firmware programming. In step 1103, the Probetype FSM is called, such that its state may be updated if necessary. The program then calls the "Bypass" FSM in step 1105, such that its state is also updated.

Shown in FIG. 12A is a state diagram of the Probetype FSM used by the backup μP 22 of the present invention. It will be understood by those skilled in the art that the Probetype FSM is called by the main program with each pass through the main program loop, and is therefore updated with each pass through the loop. The FSM will continue to progress through the indicated states until it reaches the state which is appropriate for the current state of its inputs. After initialization in state 1201, the FSM follows path "a" to "Idle" state 1203, in which it is responsive to inputs to the backup μP 22. The Probetype FSM will remain in state 1203 (i.e. follow the "b" path) under any of the following conditions: 1) the main relay is short circuited; 2) the bypass key is hot-wired; or 3) all 2-wire probes are not oscillating, no 5-wire return pulses are detected and no bypass key is detected.

Assuming neither of conditions 1) or 2) described above are true, the Probetype FSM will progress to "5-wire dry state" 1205 along path "c" when 4 valid 5-wire return pulses are detected in a row within 200 ms of each other. This state corresponds to the setting of the pulse bit high in step 1082 of FIG. 10F, and the backup μP responds by outputting the permit and the alternating permit signals to close relay 44. The FSM will remain in state 1205 (i.e. will follow path "d") as long as the backup μP 22 continues to detect the 5-wire return pulses. However, when 400 ms elapses during which no return pulse is detected, the FSM proceeds to "5-wire wet" state 1207 along path "e". The FSM will then remain in state 1207 (i.e. follow path "f") as long as 5-wire pulses are being sent to the probes, and no return pulses are detected, and no bypass key or hot-wiring of the bypass key is detected.

If four 5-wire return pulses are again detected in a row within 200 ms of each other, the FSM will proceed back to state 1205 along path "g". Furthermore if, while in state 1207, one second elapses without a pulse being transmitted to the probes, the FSM returns to state 1203 along path "h".

The FSM will proceed to "5-wire wait for relay" state 1209 from either state 1203 or state 1207 under the same conditions (assuming that, if in the Idle state, that the conditions 1) and 2) described above are not true). To proceed to state 1209 along either path "I" or path "j", there must be a 5-wire pulse being sent to the probes, no hotwiring of the bypass key detectable, and a valid bypass key being detected. In addition, from the Idle state, there can be no 2-wire oscillations detected.

In state 1209, a wait period begins during which the FSM waits for the closing of the main relay in response to the bypass key. In the preferred embodiment, the minimum wait time is one minute and, if the one minute expires without the main relay closing, the FSM will proceed to state 1207 along path "I". Until that time, or the closing of the relay, the FSM remains in state 1209 (i.e. following path "k"). The delay in the closing of the main relay is typically due to a delay in a driver operating the system closing the deadman switch. The delay allows the driver time to manually close the switch after the bypass key has been used, without the FSM going immediately into the 5-wire wet state 1207.

Once the main relay has closed, the FSM proceeds to "5-wire bypass" state 1211 along path "m". While the 5-wire output pulse is being sent to the probes, the main relay is closed, and the bypass condition has not existed for more than an hour, the FSM will remain in state 1211 (i.e. following path "n"), allowing the transfer of fluid product. However, if the main relay opens for more than 5 seconds, or a one hour bypass timer expires, the FSM proceeds to "5-wire hotwire wait" state 1213 along path "o". The 5 seconds minimum relay open time is used to ensure that the brief slipping of a driver's hand off the deadman switch will not result in the cutting off of fluid flow. If the 5-wire output pulse is not delivered for one second, the FSM will proceed from state 1211 to "2-wire bypass" state 1215 along path "r".

State 1213 is a wait state in which the FSM remains while a "hot-wire" or "presence" test is conducted to determine whether the bypass was the result of hot-wiring. In the preferred embodiment, this test involves the transmission of five reset pulses to the bypass key by the controller. If at least three "presence" pulses are detected in response, the key is assumed to be hot-wired. If the test indicates that the bypass key is hot-wired, the FSM remains in state 1213 (i.e. follows path "p"). The test is then repeated periodically (every ten milliseconds, in the preferred embodiment). Once the hot-wired condition is removed (for at least one minute, the FSM proceeds to stage 1207 via path "q".

In state 1215, the FSM responds to the lack of pulses on the probe channels by assuming that the probes are 2-wire probes. The FSM will remain in state 1215 (i.e. will follow path "ad") as long as the relay controlled by the main μP 20 (i.e. switch 44) is closed and the 1 hour bypass timer has not expired. If the switch 44 opens, or the 1-hour timer expires, however, the FSM proceeds along path "ae" to "2-wire hot-wire wait" state 1217. As with state 1213, the FSM remains in this wait state (i.e. follows path "af") until a hot-wire test is conducted. If a hot-wire condition is detected, the FSM remains in state 1217 (i.e. following path "af") until the condition is removed. Once the hot-wired condition is no longer detected, the FSM proceeds to "2-wire wet" state 1219 via path "ag".

The 2-wire states of the FSM can also be entered from idle state 1203. If, while in state 1203, all of the 2-wire probes are oscillating, and there is no detection of a short circuit across the main relay or a hot-wiring of the bypass key, the FSM will proceed along path "s" to "2-wire" dry state 1221. While all of the 2-wire probes continue to oscillate, the FSM remains in state 1221 (i.e. follows path "t"). However, if 400 ms passes during which any one of the probes are not oscillating, the FSM proceeds (along path "u") to "2-wire wet" state 1219.

As long as at least one (but not all) of the 2-wire probes are oscillating, and no bypass key or bypass hot-wiring is detected, the FSM remains in state 1219 (i.e. following path "v"). If all of the probes begin oscillating again, the FSM proceeds to the 2-wire dry state along path "w". Furthermore if, while in state 1219, a bypass key is detected, the FSM proceeds to "2-wire, wait for relay" state 1223. State 1223 is similar to state 1209, and starts a timer which provides a delay that allows a driver time to close the deadman switch.

While the timer is running, and the relay is still open, the FSM remains in state 1223 (i.e. following path "aa"). If the closing of the main relay is detected before the timer expires, the FSM proceeds to state 1215 via path "ac". If the timer expires before the closure is detected, the FSM proceeds to state 1219 via path "ab". State 1223 can also be entered from the Idle state 1203, along path "y", when a bypass key is detected, and the following conditions exist: 1) the main relay is not shorted; 2) the bypass key is not hot-wired; 3) at least one 2-wire probe is oscillating; and 4) no output pulses are being sent to the 5-wire probes.

Figure 12B:
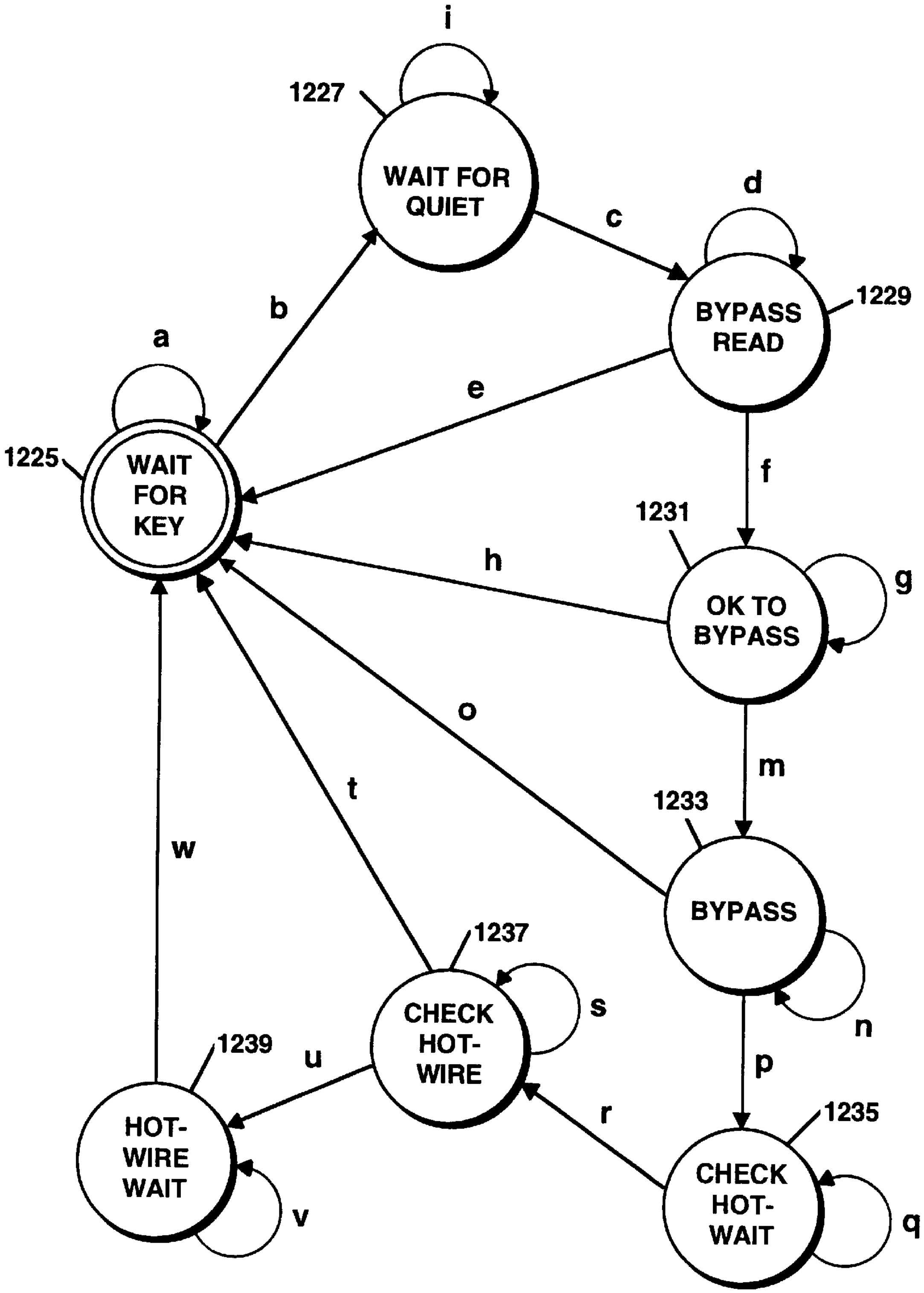
FIG. 12B is a state diagram depicting a "Bypass" finite state machine used by the firmware of the backup microprocessor of a fluid transfer controller according to the present invention.

Also called by the main program of the backup μP 22 is the "Bypass" FSM. The Bypass FSM tracks the state of the bypass mode of the backup μP, and is depicted in the state diagram of FIG. 12B. When no bypass key has been detected, the FSM remains in "Wait for key" state 1225 (i.e. following path "a"). When a bypass key "presence pulse" (a 500 μs pulse clearly distinguishable from data pulses, which signals that a key is connected) is detected, the FSM advances to state 1225 to "wait for quiet" state 1227 along path "b". The state machine follows path "i" for a short delay period (at least 100 ms in the preferred embodiment) to allow the dissipation of noise on the bypass detection input. It then proceeds to "bypass read" state 1229 along path "c".

The FSM remains in the state 1229 for a finite time period while an identification of the bypass key inputs is attempted. The backup μP makes up to ten attempts to read the bypass key inputs. If the inputs cannot be identified, or if the bypass key type (family) code in incorrect, the FSM returns to state 1225 along path "e". If the correct coded input from the bypass key is identified, the state machine proceeds to "OK to bypass" state 1231 along path "f".

In state 1231 a "bypass" variable is set which indicates that the backup μP 22 is in a bypass state, the variable being available for reading by the Probetype FSM. The Bypass state machine remains in state 1231 (i.e. follows path "g") until the backup μP has detected the closure of the relay switch 46, which it controls. If this closure is not detected within a finite time period, the state machine returns to state 1225 along path "h". If the closure is detected, the bypass condition is confirmed, and the FSM proceeds to "Bypass" state 1233.

The Bypass FSM remains in state 1233 (i.e. follows path "n") for a finite period of time which, in the preferred embodiment, is a minimum of ten seconds. If relay switch 46 opens for some reason during that time, the FSM follows path "o" back to state 1225. If the time expires with the relay still closed, the state machine proceeds (along path "p") to "check hot-wire wait state" 1235. The FSM remains in state 1235 (i.e. follows path "q") for a short delay period which, in the preferred embodiment, is two seconds. This allows a user of the bypass key time to remove the key and discontinue communication between the key and the rack controller. After the delay, the state machine proceeds (along path "r") to "check hot-wire state" 1237.

In state 1237, the backup pP undergoes a "presence test" to determine whether the bypass key inputs of the rack controller have been hot-wired. If the presence test indicates that there is no hot-wiring, the FSM returns to state 1225 via path "t". If a hotwiring is indicated, the state machine proceeds to "hot-wire wait" state 1239 via path "u". The FSM will remain in this state (i.e. follow path "v") indefinitely, until the indication of a bypass key has been absent for a finite time period (in the preferred embodiment, at least one minute). When the bypass key (presumed to be a hot-wire) is not detected for one minute, the FSM returns to state 1225 via path "w".

Figure 13A:
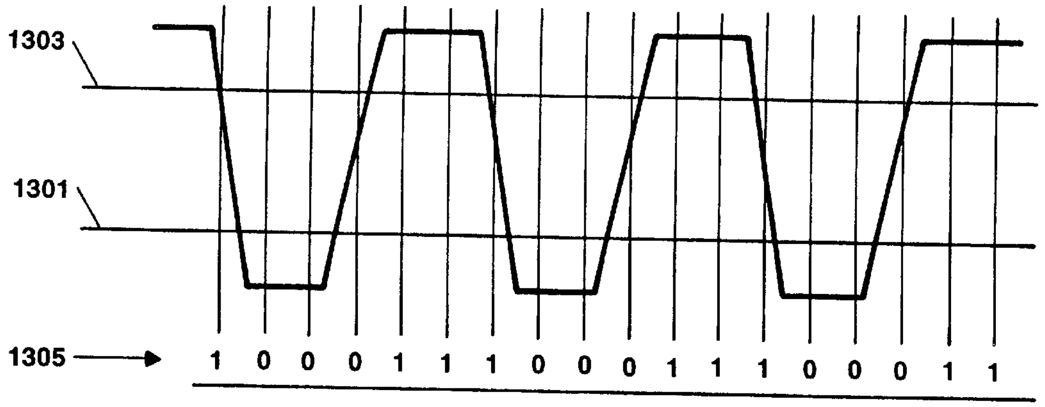
FIG. 13A is a schematic representation of a typical probe signal and the results of sampling of the signal by A/D converters used by the main microprocessor of a fluid transfer controller according to the present invention.
Figure 13B:
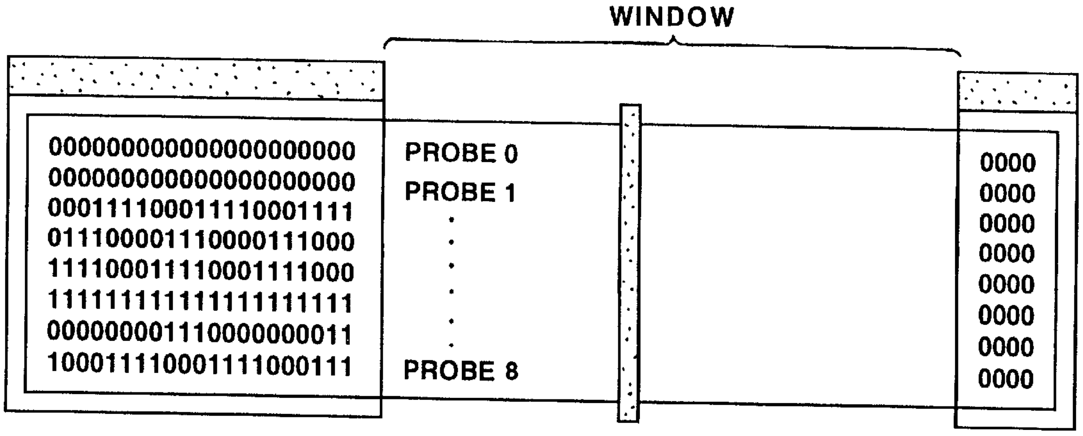
FIG. 13B is a schematic representation of a probe array formed from the probe samples detected by the main microprocessor of a fluid transfer controller according to the present invention.

In addition to the differences in the firmware of the main and backup μPs, the method of detecting probe signals is also distinctly different. FIG. 13A and 13B demonstrate a detection method which is used by the main μP 20. In each of 5-wire optic, 2-wire optic and 2-wire thermistor probes, the output of the probe is an oscillating signal when the probe is dry (i.e. no overfill condition exists). An example of such a signal is shown in FIG. 13A. For determining whether a valid probe signal is being detected by the main μP, it is necessary to determine whether the amplitude of the signal, the width of the high and low signal pulses and the signal's periodicity are within desired ranges. Although these ranges are different for the different probe types, the detection method shown in FIG. 13A is equally applicable to each.

To effect the detection method, each of the probe channels, that is, the signals received directly from the probes themselves, is input to an analog-to-digital converter (A/D). The A/D converters are preferably clocked to generate samples every two milliseconds. The samples are mathematically compared, by the main μP 20, to one of two different thresholds, shown graphically in FIG. 13A as 1301 and 1303. The lower threshold 1301 is used for the comparison if the last previous sample was above the tested threshold. The upper threshold 1303 is used for the comparison if the last previous sample was below the tested threshold. This provides a degree of hysteresis to the comparison measurements.

The output of each mathematical comparison is a single bit which is high (i.e. a logical "one") if the sample exceeds the relevant threshold or low (i.e. a logical "zero") if the sample is below the relevant threshold. Thus, the signal, if oscillating with minima and maxima below and above the threshold values, respectively, will produce a bit stream which is indicative of the periodicity of the signal. A bit stream 1305 which corresponds to the signal of FIG. 13A is represented in the figure by ones and zeroes each aligned under their corresponding sample.

With each of the probes producing a bit stream, and there being up to eight probes having inputs to the rack controller, a byte array is formed in the memory of the main μP 20 which consists of a new byte every two milliseconds, individual bits of which are from separate probes. As such, up to eight active bit streams may generate sequential eight bit bytes of probe data. A schematic illustration of such a probe array is depicted in FIG. 13B. Ones and zeroes are used to illustrate the structure of the probe array at each end of the array. While the ones and zeroes are not shown in the center region of the array, those skilled in the art will understand that the array continues from the left side of FIG. 13B to the right side of the figure.

With each bit stream of the array corresponding (from top to bottom in FIG. 13B) to each of the probe channels 0 through 7, respectively, the array provides a window showing a recent history of each bit stream. The state of each probe can therefore be ascertained from this history. This is demonstrated by the various contents of each bit stream represented in the array schematically by ones and zeroes.

As shown, both probes 0 and 1 are a consistent stream of logic zeroes, and therefore appear to be off. Probe 6 is on, but its bit stream is all logic ones, and therefore the probe appears to be wet. The bit stream of Probe 7 is oscillating, but at a slow rate. The other probes are oscillating within normal parameters. By tracking the bit streams of the array, the main μP can determine the state of each of the system probes.

Unlike the bit stream method of the main μP 20, the backup μP 22 uses (for two-wire probe signals) a hardware comparator circuit to determine whether the probes are oscillating within the desired parameters. This circuit is known in the art, and is part of the overfill sensor circuit 24 (FIG. 2). In short, each of the probe signals is fed into a comparator circuit, the output of which changes between a high and a low voltage when as the probe input changes from being above to being below a threshold voltage. Thus, the output of the comparator has a changing logic level which is detected by the backup μP, and analyzed to determine whether the probe oscillation is within acceptable parameters. The use of different detection methods for the probe signals provides another level of redundancy to the system, such that a single-point failure (such as an malfunction in the probe signal detection circuitry) does not cause an improper "Permit" condition.

As mentioned previously, the rack controller also makes use of an optical bypass key. Unlike prior art bypass keys, which have a key cylinder and electrical contacts that are physically opened and closed, the optical key of the present invention allows the transmission of bypass code information optically, from a hand-held "key" unit to the rack controller.

Figure 14:
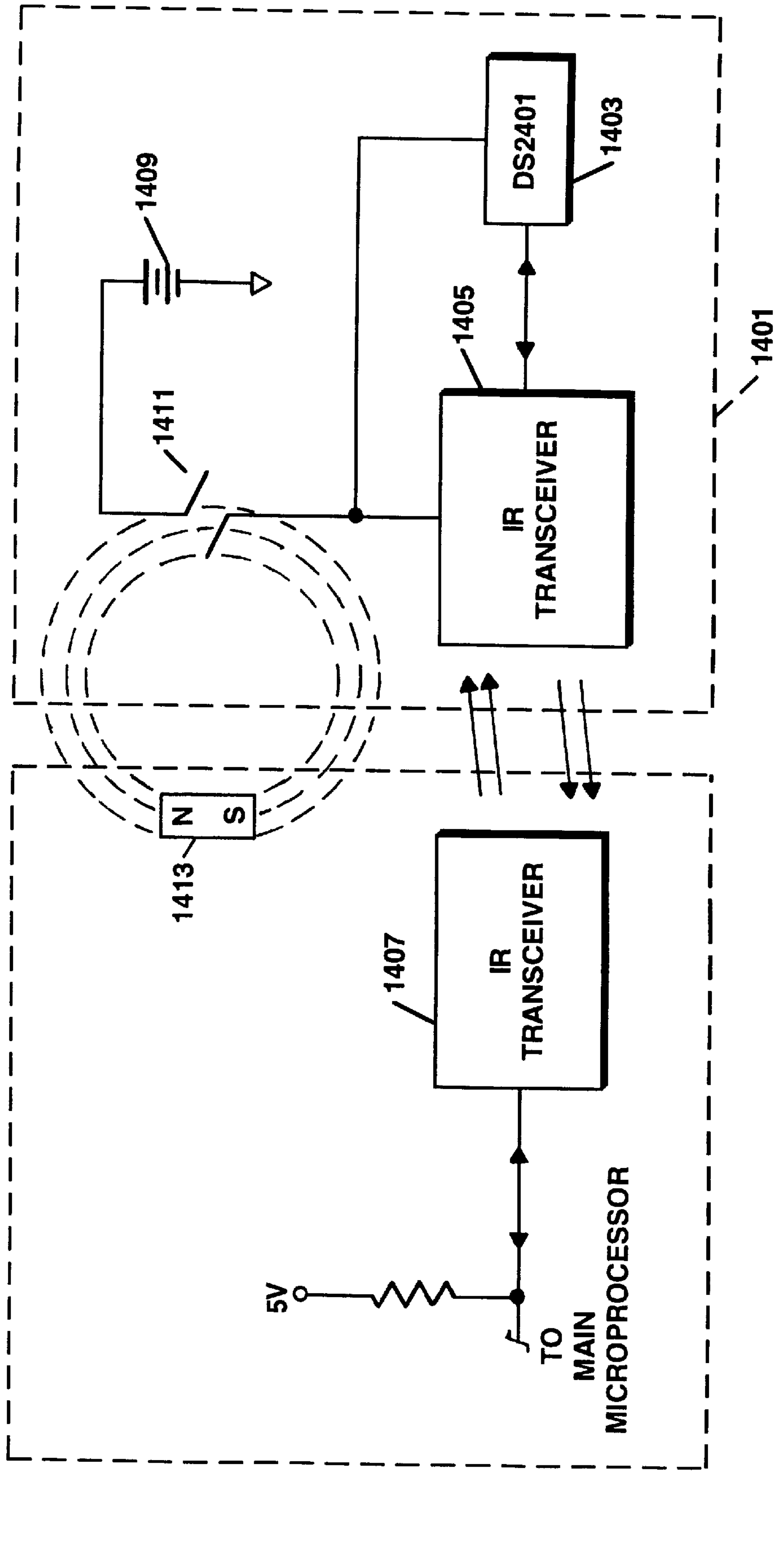
FIG. 14 is a schematic diagram of the interaction between an optical bypass key and the main microprocessor of a fluid transfer controller according to the present invention.

Depicted in FIG. 14 is a schematic diagram of the optical bypass key of the present invention. In the preferred embodiment, the key 1401 makes use of a Dallas Semiconductor DS2401 Silicon Serial Number IC 1403. Optical communication between the IC 1403 and the main μP 20 is accomplished through the use of IR transceiver circuit 1405, in the key 1401, and IR transceiver circuit 1407, in the rack controller. The key 1401 is powered by a battery 1409 when a reed switch 1411 is closed magnetically by proximity to a permanent magnet 1413 located in the rack controller. Magnetic field lines are indicated schematically in FIG. 14 to demonstrate the effect of the magnet 1413 on the reed switch 1411.

A bidirectional, single-line protocol is used in transmitting information between IC 1403 and IR transceiver 1405, as well as between the main μP 20 and IR transceiver 1407. To accommodate this protocol, particular designs for the transceiver circuits 1405 and 1407 are used.

Figure 14A:
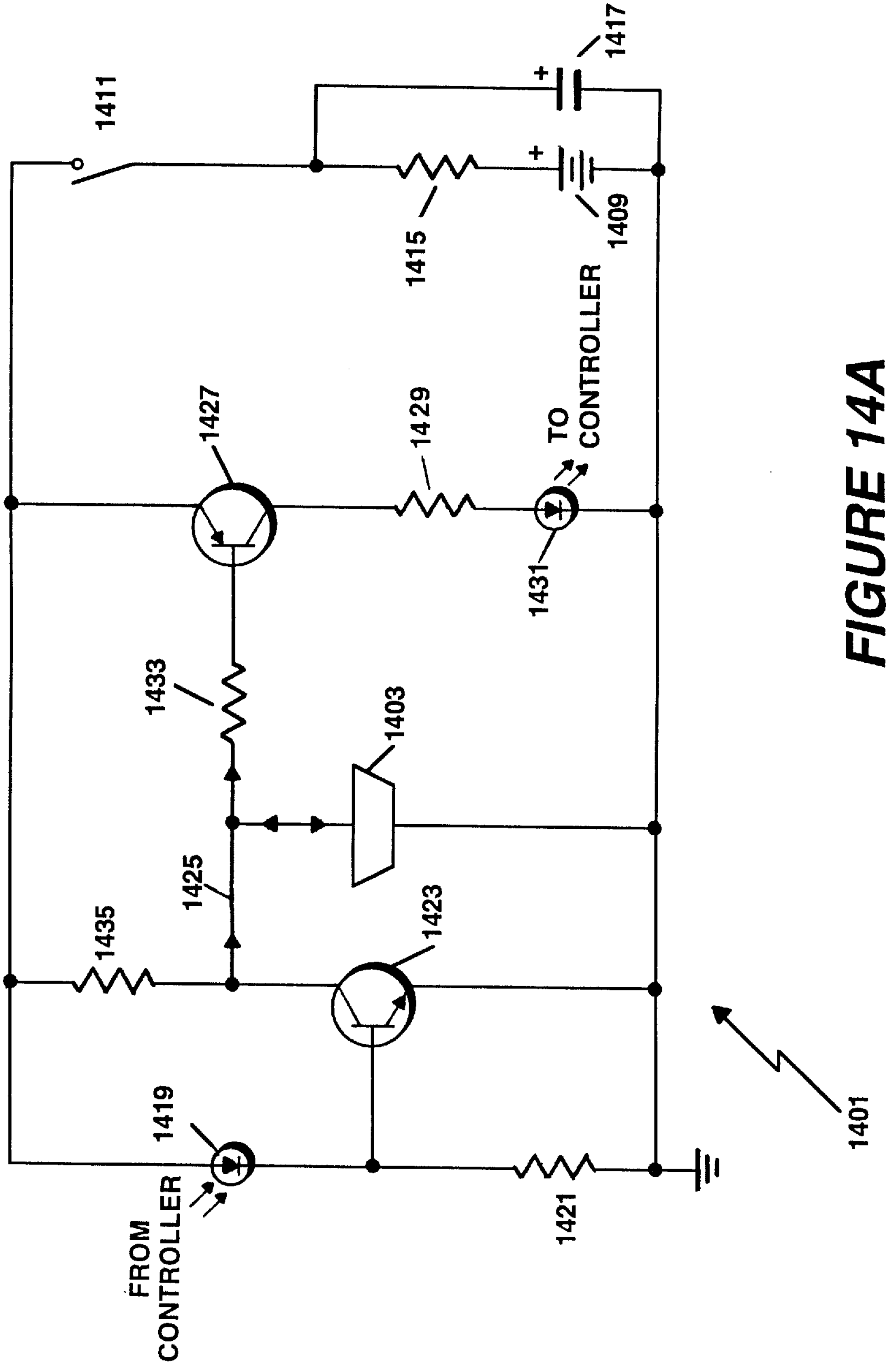
FIG. 14A a circuit schematic of an optical bypass key used with a fluid transfer controller according to the present invention.

A preferred circuit for the key 1401 is shown in FIG. 14A. As shown, power is provided by battery 1409, as switched by reed switch 1411. Current limiting resistor 1415 and filtering capacitor 1417 are provided for the battery, as is conventional in the art. As infrared optical signals are detected by the photodiode 1419, a voltage is developed across resistor 1421 which switches transistor 1423. As the transistor switches "on" with each pulse of light detected by the photodiode 1419, a low pulse is delivered along conductor 1425 and is detected along the bidirectional input/output path of the IC 1403. Similarly, when logic data is output by the IC 1403, it develops a voltage at the base of transistor 1427 which, in turn, causes current flow through resistor 1429 and IR LED 1431. This causes the transmission of IR pulses which are then detected by the rack controller. Resistors 1433 and 1435 have values selected for appropriate current limiting.

Figure 14B:
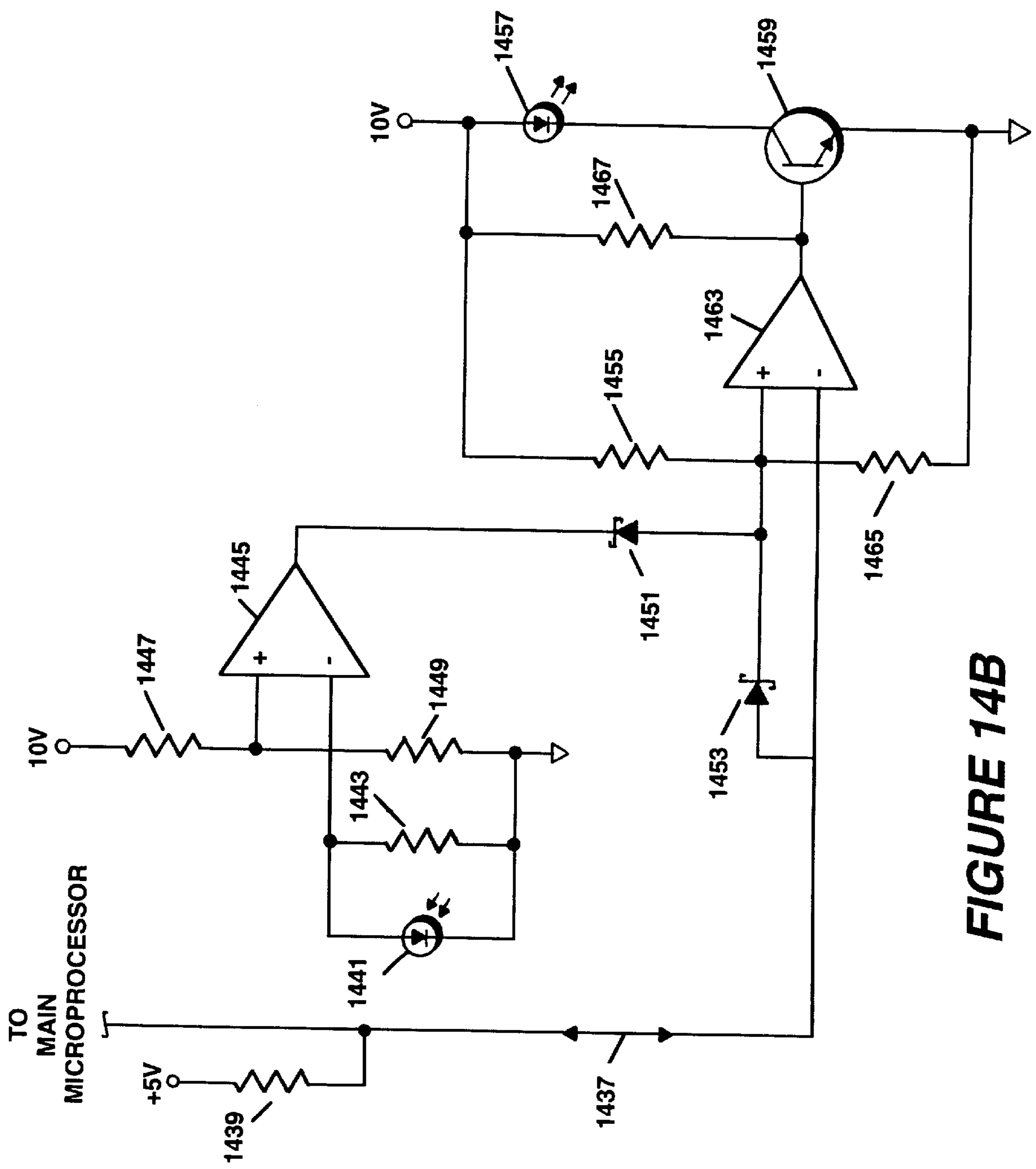
FIG. 14B is a circuit schematic of the main microprocessor IR transceiver circuitry which enables communication with the optical bypass key used with a fluid transfer controller according to the present invention.

In FIG. 14B, the circuitry of the IR transceiver 1407 is depicted. On bidirectional input/output line 1437, the main μP 20 both detects and transmits data. Transmitted and received data on line 1437 is in the form of low logic pulses (approximately zero volts), the line 1437 being normally at 5 volts, as provided by a 5 V source fed through current-limiting resistor 1439. Although a bidirectional data line is not required, its use necessitates some additional circuit elements to prevent the latching up of the two-way communications. That is, without some protection, a signal detected by the IR transceiver 1407 and placed on bidirectional data line 1437 is not distinguishable from a signal output by the main μP.

As an IR signal from the key is detected by photodiode 1441, a corresponding voltage is developed across resistor 1443, and is present at the negative input terminal of comparator 1445. The positive input terminal of comparator 1445 is biased to a small voltage by resistors 1447 and 1449. Preferably, the resistors are selected so that the bias voltage is no higher than about 0.5 V. Thus, while there is no input signal to photodiode 1441 (which keeps the negative terminal at ground), the output of the comparator 1445 is an open collector type output (i.e. is not conducting). However, when an optical signal is detected, the voltage which is developed at the negative terminal of the comparator 1445 causes a small positive voltage at the output of the comparator 1445. This low voltage is preferably between 0.2 and 0.4 volts.

The conversion of the detected optical signal to the low output voltage of the comparator 1445 causes the bidirectional line 1437 to be pulled low with each detected signal. This allows detection of the signal by the main μP 20. The low output of comparator 1445 must be small enough such that the ouput in combination with the voltage drops of Schottky diodes 1451,1453 is small enough to present a logic low to the bidirectional line 1437. Resistors 1455 and 1439 are high in value to minimize the forward voltage drop of diodes 1451 and 1453.

The optical output signal from the rack controller to the bypass key is generated using IR LED 1457, which is driven by transistor 1459 and current-limiting resistor 1461. The base of the transistor is fed by comparator 1463, for which a biasing voltage of about 2.5 V is provided on the positive input terminal by the resistive divider formed by resistors 1455 and 1465. Since the negative terminal of the comparator is maintained at a voltage approximately 0.15 V higher than the positive terminal by the voltage drop of Schottky diode 1453, the output of the comparator 1463 is normally negative, keeping transistor 1459 switched "off". However, when the main μP 20 pulls the bidirectional line 1437 low (less than 0.1 V), the comparator output voltage becomes a positive voltage, causing the LED 1457 to be turned "on". Resistor 1467 is provided to help more precisely control the current through the LED 1457 when the comparator output becomes positive.

In the preferred embodiment, and in conjunction with the known protocol of the Dallas Semiconductor IC 1403, the main μP 20 periodically outputs a pulse to monitor for the presence of the bypass key 1401. The backup μP 22 has access to the bidirectional output and alternates interrogation of the bypass key with the main μP 20, since the main μP bidirectional output is tri-stated when not in use. When the key detects the pulse, it responds with a presence pulse, which is detected by the IR transceiver of the rack controller. The detection of the presence pulse is used to verify the presence of a bypass key by the firmware of the main μP. The microprocessor 20 then outputs another signal which prompts the output of the information stored in the Dallas Semiconductor IC 1403, which is then read by the microprocessor.

Figure 15:
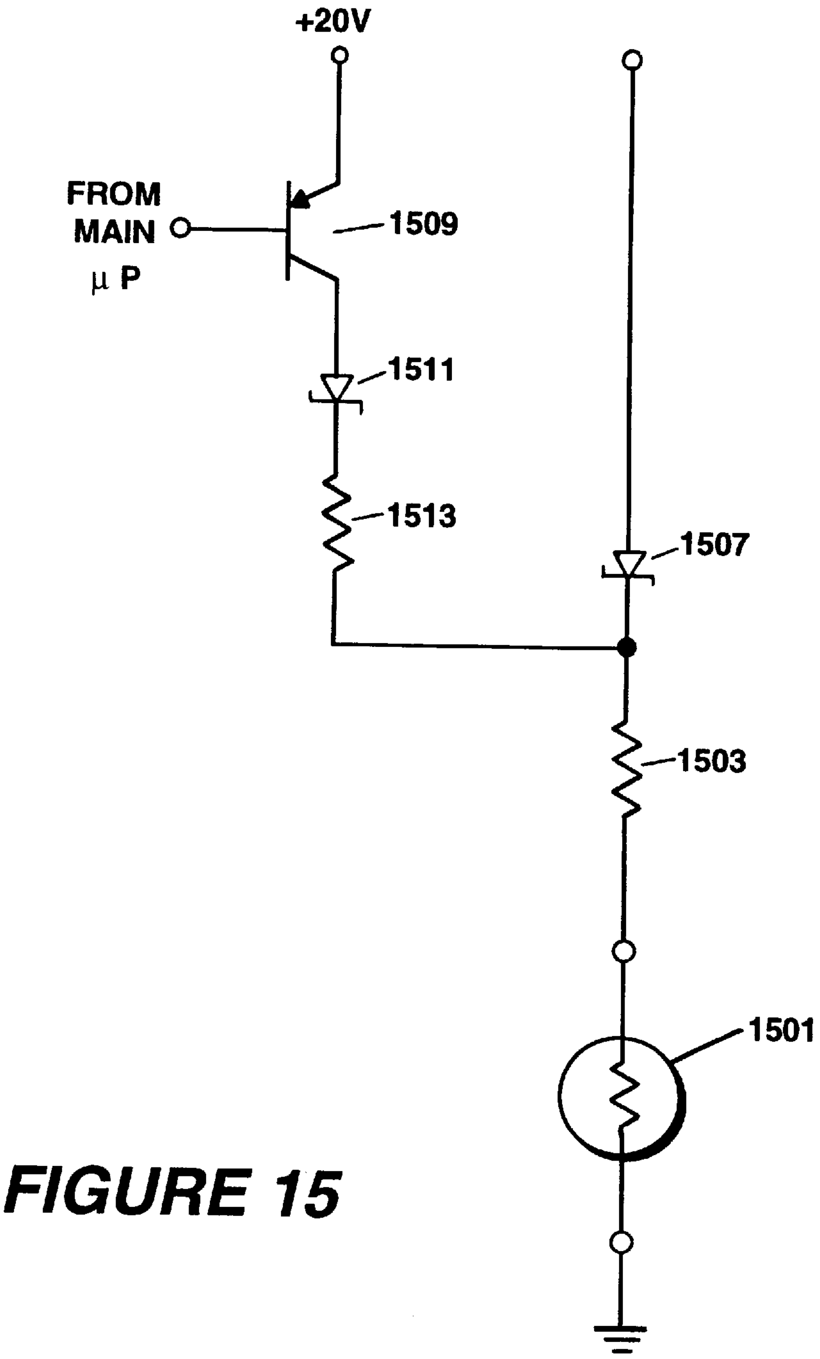
FIG. 15 is a typical "jumpstart" curcuit.

Shown in FIG. 15 is a "jumpstart" circuit which may be used to preheat standard thermistor probes (e.g. Scully Signal Company "Dynaprobe"). Because the impedance of such thermistor probes is inversely proportional to temperature, very cold ambient temperatures (as typical during winter months in cold weather regions) result in the initial impedance of the probes being relatively high. Thus, the time necessary to heat the probes to operating temperature is longer than might be desired. Furthermore, since the impedance of the probes increases with decreasing temperatures, power dissipation in the probes also decreases with a decrease in temperature, resulting in a non-linear increase in probe warm-up time.

When a truck to be loaded is connected to the controller at the loading rack, and the probes are detected as being standard type thermistor probes, a conventional switching circuit (not shown) is controlled by the main μP 20 to connect a thermistor probe 1501 to its respective jumpstart circuit as shown in FIG. 15 (only one circuit is shown, but it will be understood that the jumpstart circuit for each of the probe channels is identical to that shown in FIG. 15). At normal operating temperatures, each thermistor probe is powered by a ten-volt supply in series with a current limiting resistor 1503. However, when first connected to the probes 1501, the main μP 20 (as part of its firmware program) initiates a "jumpstart" function by asserting low a normally-high control signal on the base of PNP transistor 1509. This switches in a twenty-volt supply voltage which passes current to the thermistor probes via current-limiting resistors 1513 and 1503, significantly increasing the power dissipation of the thermistor probes and decreasing the warm-up time. Shottky diodes 1507, 1511 provide isolation of the ten-volt and twenty-volt power supplies from each other.

The main μP 20 maintains the control signal in its low state for a predetermined time (about twenty seconds in the preferred embodiment), after which the signal is brought high again to switch out the twenty-volt power source. However, by that time, the impedance of the thermistor probes has dropped significantly, and the normal ten-volt supply is sufficient to quickly bring the probes to operating temperature. In the preferred embodiment, the main μP will switch out the twenty-volt power source before the elapse of the predetermined time if it detects oscillations on any of the thermistor probes (indicating that their operating temperature has been reached). Furthermore, the backup μP 22 monitors the control signal from the main μP 20 and, as a precaution, refuses to permit at any time the jumpstart signal is being output by the main μP 20. In addition, voltage supplies higher or lower than the twenty-volt supply may also be used, with higher voltage supplies further decreasing the warm-up time.

While the invention has been shown and described with reference to a preferred embodiment thereof, it will be understood by those skilled in the art that various changes in form and detail may be made therein without departing from the spirit and scope of the invention as defined by the appended claims.

What is claimed is:

1. A fluid transfer control apparatus for controlling a transfer of fluid from a fluid source to a receiving container and for detecting and responding to an input signal which indicates whether fluid transfer should occur, the apparatus comprising:

- a first switch responsive to a first control signal which switches to a first switch position when the first control signal is received,
- a second switch responsive to a second control signal which switches to a first switch position when the second control signal is received, and which is arranged in conjunction with the first switch such that fluid transfer to said container is prevented unless the first switch is in its first switch position and the second switch is in its first switch position;
- a first controller which is responsive to the input signal and which outputs the first control signal when the input signal indicates that fluid transfer should occur; and
- a second controller responsive to the input signal which outputs the second control signal when the input signal indicates that fluid transfer should occur.

2. An apparatus according to claim 1 further comprising a switch position sensor for detecting when the first switch is in the first switch position and causing the generation of a first detection signal indicative thereof.

3. An apparatus according to claim 2 wherein the first detection signal is received by the second controller and wherein, when the input signal does not indicate that fluid transfer should occur and the first detection signal indicates that the first switch is in the first position, the second controller does not output the second control signal.

4. An apparatus according to claim 2 wherein the first detection signal is received by the first controller and wherein, when the input signal does not indicate that fluid transfer should occur and the first detection signal indicates that the first switch is in the first position, the first controller does not output the first control signal.

5. An apparatus according to claim 2 wherein the switch position sensor is a first switch position sensor and the apparatus further comprises a second switch position sensor for detecting when the second switch is in the first switch position and outputting a second detection signal indicative thereof.

6. An apparatus according to claim 5 wherein the second detection signal is received by the first controller and wherein, when the input signal does not indicate that fluid transfer should occur and the second detection signal indicates that the second switch is in the first position, the first controller does not ouput the first control signal.

7. An apparatus according to claim 5 wherein the second detection signal is received by the second controller and wherein, when the input signal does not indicate that fluid transfer should occur and the second detection signal indicates that the second switch is in the first position, the second controller does not ouput the second control signal.

8. An apparatus according to claim 1 further comprising a fluid level detector responsive to a fluid level in the container exceeding a predetermined level and preventing the input signal from indicating that fluid transfer should occur when said fluid level in the container exceeds said predetermined level.

9. An apparatus according to claim 1 further comprising a ground sensor which detects the presence of a common electrical ground between the fluid source and the container and causes the input signal to indicate that fluid transfer should occur only when the presence of said common electrical ground is detected.

10. An apparatus according to claim 1 wherein the first switch and the second switch are electrical relays.

11. An apparatus according to claim 1 wherein the first control signal comprises a DC signal and a time-varying signal, and wherein both the DC signal and the time-varying signal must be present simultaneously to switch the first switch to the first position.

12. An apparatus according to claim 1 wherein:

- the first controller comprises a first data processor and responds to the input signal and outputs the first control signal according to a first set of program instructions of the first data processor; and
- the second controller comprises a second data processor and responds to the input signal and outputs the second control signal according to a second set of program instructions of the second data processor which is distinctly different than the first set of program instructions.

13. A fluid transfer control apparatus for controlling a transfer of fluid from a fluid source to a receiving container and for detecting and responding to an input signal which indicates whether fluid transfer should occur, the apparatus comprising:

a first switch having a first switch position;

a second switch having a first switch position and being arranged in conjunction with the first switch such that fluid transfer to said container is prevented unless the first switch is in its first switch position and the second switch is in its first switch position;

a first controller which is responsive to the input signal, and which controls the first switch and detects when the second switch is in the first position, the first controller preventing the first switch from being switched to the first position when the second switch is in the first position and the input signal does not indicate fluid transfer should occur; and a second controller which is responsive to the input signal, and which controls the second switch and detects when the first switch is in the first position, the second controller preventing the second switch from being switched to the first position when the first switch is in the first position and the input signal does not indicate that fluid transfer should occur.

14. An apparatus according to claim 13 wherein:

the first controller comprises a first data processor having a first set of program instructions for responding to the input signal with the first controller, controlling the first switch, detecting when the second switch is in the first position, and preventing the first switch from being switched to the first position; and the second controller comprises a second data processor, and the functions of responding to the input signal with the second controller, controlling the second switch, detecting when the first switch is in the first position, and preventing the second switch from being switched to the first position are performed according to a second set of program instructions of the second data processor which is distinctly different from the first set of program instructions of the first data processor.

15. An apparatus according to claim 13 wherein the first controller controls the first switch with a DC signal and a time-varying signal, and wherein both the DC signal and the time-varying signal must be present simultaneously to switch the first switch to the first position.

16. An apparatus according to claim 13 wherein the first switch and the second switch are electrical relays.

17. A method of controlling fluid transfer control apparatus for transferring fluid from a fluid source to a receiving container and for detecting and responding to an input signal which indicates whether fluid transfer should occur, the method comprising:

providing a first switch responsive to a first control signal which switches to a first switch position when the first control signal is received;, providing a second switch responsive to a second control signal which switches to a first position when the second control signal is received;

arranging the first switch and second switch such that fluid transfer to the container is prevented unless the first switch is in its first switch position and the second switch is in its first position;

controlling the output of the first control signal with a first controller which is responsive to the input signal and which causes transmission of the first control signal to the first switch when the input signal indicates that fluid transfer should occur;

controlling the output of the second control signal with a second controller which is responsive to the input signal and which causes transmission of the second control signal to the second switch when the input signal indicates that fluid transfer should occur.

18. A method according to claim 17 further comprising detecting, with a switch position sensor, when the first switch is in the first switch position and causing the generation of a first detection signal indicative thereof.

19. A method according to claim 18 comprising inputting the first detection signal to the second controller and, when the input signal does not indicate that fluid transfer should occur and the first detection signal indicates that the first switch is in the first position, preventing the second controller from causing transmission of the second control signal.

20. A method according to claim 18 wherein the switch position sensor is a first switch position sensor and the method further comprises detecting, with a second switch position sensor, when the second switch is in the first switch position and causing the generation of a second detection signal indicative thereof.

21. A method according to claim 20 further comprising receiving the second detection signal with the first controller and, when the input signal does not indicate that fluid transfer should occur and the second detection signal indicates that the second switch is in the first position, preventing the first controller from causing transmission of the first control signal.

22. A method according to claim 17 further comprising detecting the presence of a common electrical ground between the fluid source and the container and causing the input signal to indicate that fluid transfer should occur only when the electrical ground is detected.

23. A method according to claim 17 wherein providing a first switch which is responsive to a first control signal comprises providing a first switch which is responsive to a first control signal made up of a DC signal and a time-varying signal, and wherein both the DC signal and the time-varying signal must be present simultaneosly before the first switch switches to the first switch position.

24. A method of controlling a fluid transfer control apparatus for transferring fluid from a fluid source to a receiving container and for detecting and responding to an input signal which indicates whether fluid transfer should occur, the method comprising:

providing a first switch having a first switch position;

providing a second switch having a first switch position;

arranging the first switch and the second switch such that fluid transfer to said container is prevented unless the first switch is in its first position and the second switch is in its first position;

detecting when the second switch is in the first position;

controlling the first switch with a first controller which is responsive to the input signal and the position of the second switch such that the first switch is prevented from switching to the first position when the second switch is in the first position and the input signal does not indicate that fluid transfer should occur;

detecting when the first switch is in the first position; and controlling the second switch with a second controller which is responsive to the input signal and the position of the first switch such that the second switch is prevented from switching to the first position when the first switch is in the first position and the input signal does not indicate that fluid transfer should occur.

25. A method according to claim 24 wherein controlling the first switch with a first controller comprises controlling the first switch with a first data processor and controlling the second switch with a second controller comprises controlling the second switch with a second data processor, and wherein the method further comprises:

executing a set of program instructions of the first data processor to initiate the functions of responding to the input signal with the first controller, controlling the first switch, detecting when the second switch is in the first position, and preventing the first switch from being switched to the first position; and executing a set of program instructions of the second data processor to initiate the functions of responding to the input signal with the second controller, controlling the second switch, detecting when the first switch is in the first position, and preventing the second switch from being switched to the first position.

26. A method according to claim 24 wherein controlling the first switch with a first controller further comprises controlling the first switch with a DC signal and a time-varying signal such that both the DC signal and the time-varying signal must be present simultaneously to switch the first switch to the first position.

27. A fluid transfer control apparatus for controlling a transfer of fluid from a fluid source to a receiving container, the apparatus comprising:

a switch which, when switched to a first position, allows a permit signal to be conducted between a first electrical contact and a second electrical contact so as to enable fluid transfer from the fluid source to the receiving container;

a sensing circuit which detects a status signal indicative of whether the switch is in the first position; and a signal blocker which blocks the status signal such that the status signal is not detectable at the second electrical contact relative to a predetermined electrical neutral.

28. A fluid transfer control apparatus according to claim 27 wherein the sensing circuit comprises a voltage sensing circuit which detects a voltage developed between the first electrical contact and the second electrical contact.

29. A fluid transfer control apparatus according to claim 28 wherein the sensing circuit causes the generation of an output signal in response to the status signal, and wherein the sensing circuit comprises an optoisolator which provides electrical isolation between the status signal and the output signal.

30. A fluid transfer control apparatus according to claim 27 wherein the signal blocker comprises a blocking diode located in an electrical path between the sensing circuit and at least one of the first electrical contact and the second electrical contact.

31. A fluid transfer control apparatus according to claim 30 wherein the blocking diode is a first blocking diode located in a first electrical path between the sensing circuit and the first electrical contact and wherein the apparatus further comprises a second blocking diode located in a second electrical path between the sensing circuit and the second electrical contact.

32. A fluid transfer control apparatus according to claim 31 wherein the permit signal is a time-varying signal.

33. A fluid transfer control apparatus according to claim 27 wherein the status signal is derived from electrical current from the permit signal that is passed through passive electrical components.

34. A fluid transfer control apparatus according to claim 33 wherein the permit signal is applied from an external signal source and wherein the apparatus further comprises an internal signal source which generates an internal signal when the permit signal is not present at said electrical contacts and allows the development of the status signal from the internal signal.

35. A fluid transfer control apparatus according to claim 27 wherein the switch is a first switch and wherein the apparatus further comprises a second switch in electrical series with the first switch between the first electrical contact and the second electrical contact and having a first position in which electrical conduction is allowed through the second switch such that the permit signal is conducted between the first electrical contact and the second electrical contact only when the first switch is in the first position and the second switch is in the first position, and wherein the sensing circuit detects a first status signal from the first switch and a second status signal from the second switch so as to determine whether the first switch is in the first switch position and whether the second switch is in the first switch position.

36. A fluid transfer control apparatus according to claim 35 wherein the sensing circuit causes the generation of a first output signal in response to the first status signal and a second output signal in response to the second status signal and wherein the sensing circuit further comprises a first optoisolator which provides electrical isolation between the first status signal and the first output signal and a second optoisolator which provides electrical isolation between the second status signal and the second output signal.

37. A fluid transfer control apparatus for controlling a transfer of fluid from a fluid source to a receiving container and for detecting and responding to an input signal which indicates whether fluid transfer should occur, the apparatus comprising:

a switch responsive to a control signal which switches to a first switch position when the control signal is received, the switch being located such that fluid transfer is inhibited when the switch is not in the first position;

a controller which is responsive to the input signal and which outputs the first control signal when the input signal indicates that fluid transfer should occur, the controller comprising a controller signal receiver by which optical signals can be received and input to the controller, and a controller signal generator by which the controller can cause the generation of an optical signal; and a bypass key comprising a bypass key signal generator for generating an optical signal which may be transmitted to the signal receiver from the bypass key with no physical contact and no electrical contact between the generator and the receiver and a bypass key signal receiver by which the bypass key can receive optical signals generated by the controller signal generator, thus allowing two-way communication between the controller and the bypass key.

38. A fluid transfer control apparatus according to claim 37 wherein the optical signal is a bypass signal which, when received by the controller, causes the controller to output a control signal which causes the switch to switch to the first switch position despite an indication of the input signal that fluid transfer should not occur.

39. A fluid transfer control apparatus according to claim 38 wherein the controller ignores the bypass signal unless the input signal indicates that fluid transfer should not occur.

40. A fluid transfer control apparatus according to claim 37 wherein the optical signal generator is part of a hand-held optical bypass key for bypassing normal operation of the fluid transfer control apparatus.

41. A fluid transfer control apparatus according to claim 40 wherein the optical bypass key comprises a battery power source.

42. A fluid transfer control apparatus according to claim 41 wherein the optical bypass key further comprises a reed switch separating the battery power source from the optical signal generator and wherein the fluid transfer control apparatus further comprises a magnetic source for closing the reed switch when the optical bypass key is within a certain distance from the magnetic source.

* * * * *